US011145755B2

(12) United States Patent
Wehrhahn-Kilian et al.

(10) Patent No.: US 11,145,755 B2
(45) Date of Patent: Oct. 12, 2021

(54) SILICON CARBIDE SEMICONDUCTOR COMPONENT WITH EDGE TERMINATION STRUCTURE

(71) Applicant: Infineon Technologies AG, Neubiberg (DE)

(72) Inventors: Larissa Wehrhahn-Kilian, Erlangen (DE); Rudolf Elpelt, Erlangen (DE); Roland Rupp, Lauf (DE); Ralf Siemieniec, Villach (AT); Bernd Zippelius, Erlangen (DE)

(73) Assignee: Infineon Technologies AG, Neubiberg (DE)

( * ) Notice: Subject to any disclaimer, the term of this patent is extended or adjusted under 35 U.S.C. 154(b) by 343 days.

(21) Appl. No.: 16/197,151

(22) Filed: Nov. 20, 2018

(65) Prior Publication Data
US 2019/0165159 A1 May 30, 2019

(30) Foreign Application Priority Data

Nov. 24, 2017 (DE) .......................... 102017127848.6

(51) Int. Cl.
*H01L 29/78* (2006.01)
*H01L 29/10* (2006.01)
(Continued)

(52) U.S. Cl.
CPC ...... *H01L 29/7811* (2013.01); *H01L 29/0615* (2013.01); *H01L 29/0696* (2013.01);
(Continued)

(58) Field of Classification Search
CPC ............. H01L 29/7811; H01L 29/0615; H01L 29/0696; H01L 29/0865; H01L 29/1095;
(Continued)

(56) References Cited

U.S. PATENT DOCUMENTS

2009/0212301 A1   8/2009 Zhang et al.
2017/0110544 A1*  4/2017 Hoshi ................ H01L 29/2003
(Continued)

FOREIGN PATENT DOCUMENTS

DE   112012004043 T5    7/2014
DE   102016105041 A1   10/2016
JP       2009302091 A   12/2009

OTHER PUBLICATIONS

Kimoto, T., et al., "Ultrahigh-Voltage SiC Bipolar Devices for Future Power Infrastructure", 43rd European Solid State Device Research Conference, Sep. 2013.

*Primary Examiner* — Fernando L Toledo
*Assistant Examiner* — Neil R Prasad
(74) *Attorney, Agent, or Firm* — Murphy, Bilak & Homiller, PLLC

(57) ABSTRACT

A semiconductor component includes a SiC semiconductor body having an active region and an edge termination structure at least partly surrounding the active region. A drift zone of a first conductivity type is formed in the SiC semiconductor body. The edge termination structure includes: a first doped region of a second conductivity type between a first surface of the SiC semiconductor body and the drift zone, the first doped region at least partly surrounding the active region and being spaced apart from the first surface; a plurality of second doped regions of the second conductivity type between the first surface and the first doped region; and third doped regions of the first conductivity type separating adjacent second doped regions of the plurality of second doped regions from one another in a lateral direction.

20 Claims, 19 Drawing Sheets

(51) Int. Cl.
*H01L 29/16* (2006.01)
*H01L 29/08* (2006.01)
*H01L 29/417* (2006.01)
*H01L 29/06* (2006.01)
*H01L 29/861* (2006.01)
*H01L 29/739* (2006.01)
H01L 21/04 (2006.01)
H01L 29/66 (2006.01)

(52) U.S. Cl.
CPC ...... *H01L 29/0865* (2013.01); *H01L 29/1095* (2013.01); *H01L 29/1608* (2013.01); *H01L 29/41741* (2013.01); *H01L 29/41766* (2013.01); *H01L 29/7395* (2013.01); *H01L 29/7396* (2013.01); *H01L 29/7397* (2013.01); *H01L 29/7813* (2013.01); *H01L 29/8611* (2013.01); *H01L 21/0465* (2013.01); *H01L 29/66068* (2013.01)

(58) Field of Classification Search
CPC ........... H01L 29/1608; H01L 29/41741; H01L 29/41766; H01L 29/7395; H01L 29/7396; H01L 29/7397; H01L 29/7813; H01L 29/8611; H01L 21/0465; H01L 29/66068
See application file for complete search history.

(56) References Cited

U.S. PATENT DOCUMENTS

2017/0111037 A1* 4/2017 Shiigi ................. H01L 29/7802
2017/0170259 A1   6/2017 Nakano et al.
2017/0345817 A1* 11/2017 Nishimura .......... H01L 27/0623

* cited by examiner

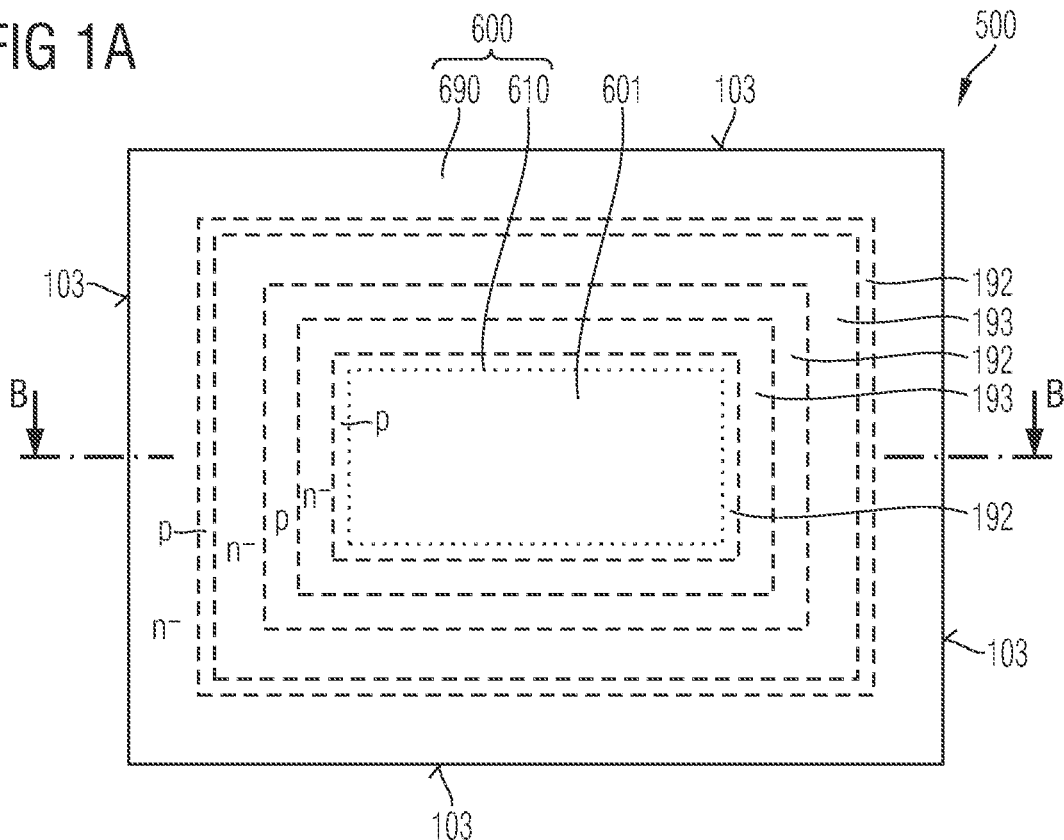
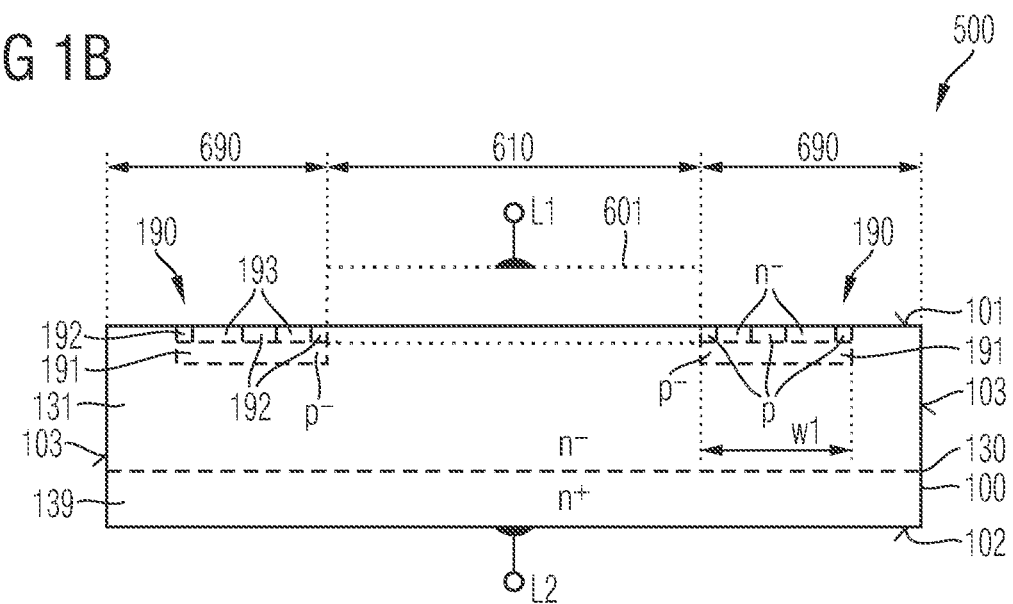

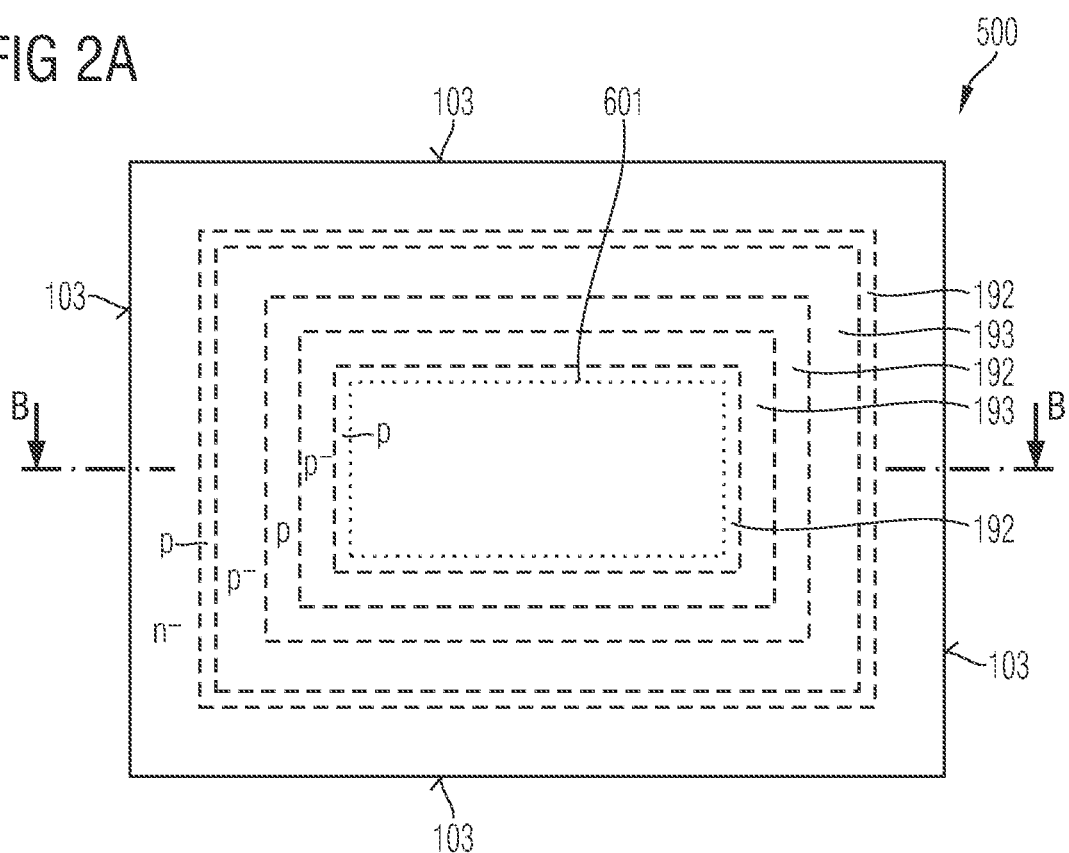
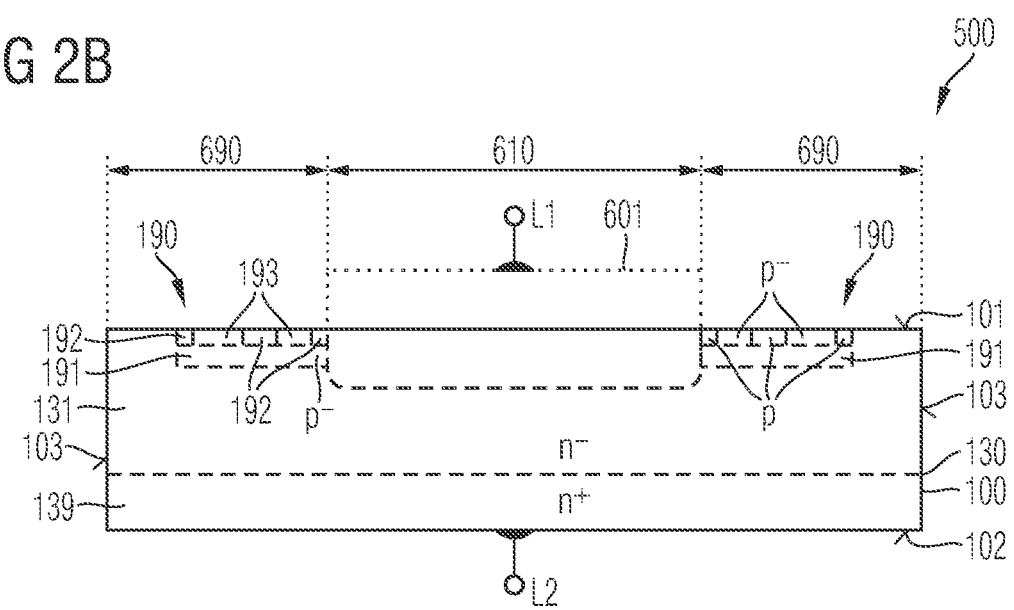

FIG 11A
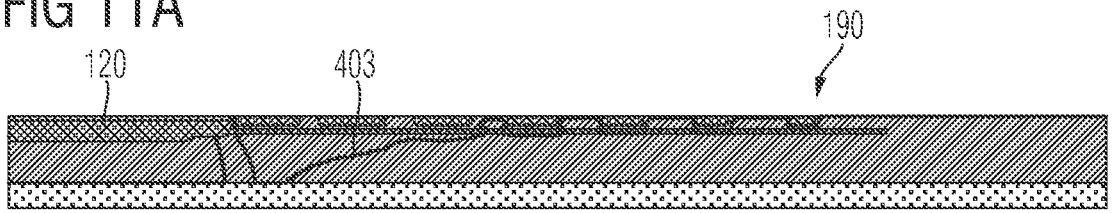
FIG 11B
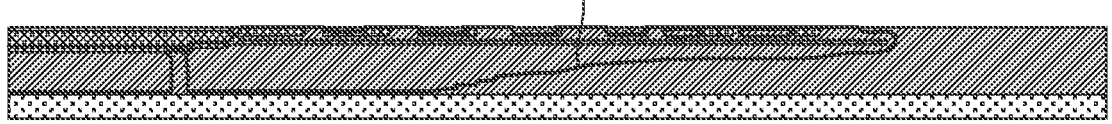
FIG 11C
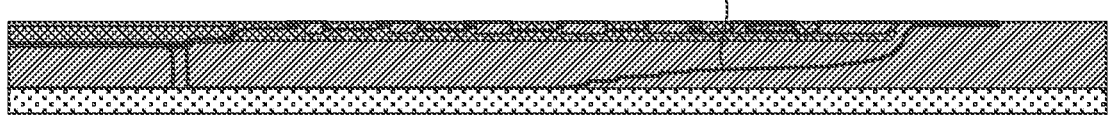
FIG 11D
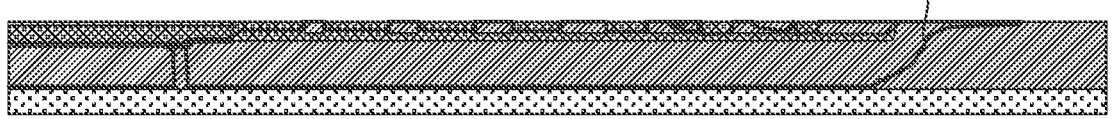
FIG 11E
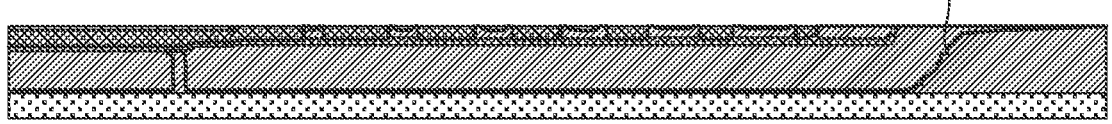
FIG 11F
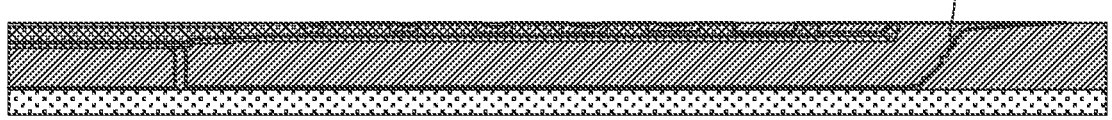
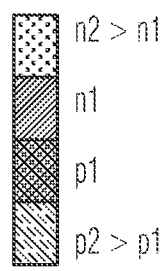

FIG 12A
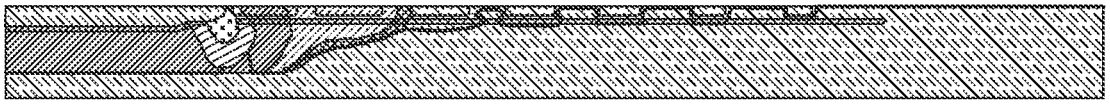
FIG 12B
FIG 12C
FIG 12D
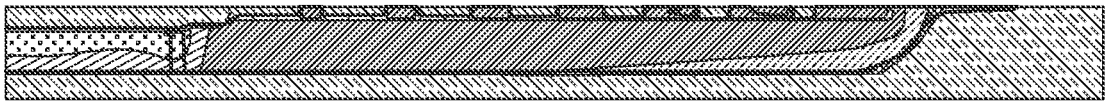
FIG 12E
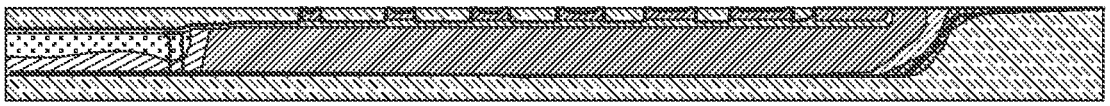
FIG 12F
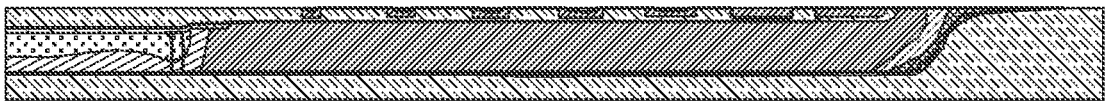
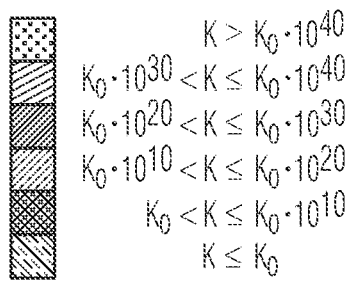
$K > K_0 \cdot 10^{40}$
$K_0 \cdot 10^{30} < K \leq K_0 \cdot 10^{40}$
$K_0 \cdot 10^{20} < K \leq K_0 \cdot 10^{30}$
$K_0 \cdot 10^{10} < K \leq K_0 \cdot 10^{20}$
$K_0 < K \leq K_0 \cdot 10^{10}$
$K \leq K_0$

FIG 13A
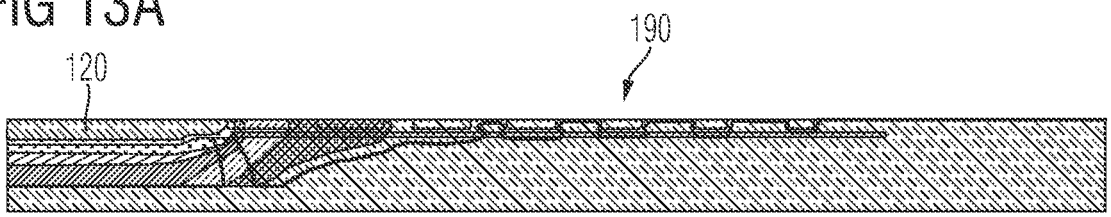
FIG 13B
FIG 13C
FIG 13D
FIG 13E
FIG 13F
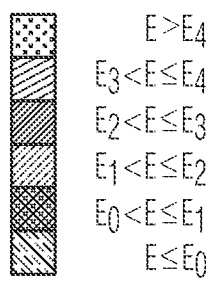
$E > E_4$
$E_3 < E \leq E_4$
$E_2 < E \leq E_3$
$E_1 < E \leq E_2$
$E_0 < E \leq E_1$
$E \leq E_0$

SILICON CARBIDE SEMICONDUCTOR COMPONENT WITH EDGE TERMINATION STRUCTURE

BACKGROUND

In vertical power semiconductor components a load current flows between a first load electrode on the front side and a second load electrode on the rear side of the semiconductor component. In the off state, the reverse voltage is dropped in a vertical direction between the first and second load electrodes and in a lateral direction across an edge termination region between a central, active region of the semiconductor component and a structure formed along the lateral side surface of the semiconductor body with the electrical potential of the second load electrode. For the lateral field reduction, power semiconductor components comprise JTE (Junction Termination Extension) regions, for example, the dopant concentration of which may decrease with decreasing distance from the side surface, or near-surface, floating and oppositely doped regions separated from one another (so-called guard rings). In semiconductor components composed of semiconductor materials in which the diffusion coefficients of dopants are small, edge termination structures such as are known from conventional silicon technology are less effective or more complicated to produce owing to the steeper pn junctions.

The present application is directed to a silicon carbide semiconductor component having improved edge termination.

SUMMARY

The present disclosure relates to a semiconductor component comprising an SiC semiconductor body having an active region and an edge termination structure at least partly surrounding the active region. In the SiC semiconductor body a drift zone of a first conductivity type is formed. The edge termination structure comprises a first doped region of a second conductivity type between a first surface of the SiC semiconductor body and the drift zone. The first doped region at least partly surrounds the active region and is spaced apart from the first surface. The edge termination structure additionally comprises a plurality of second doped regions of the second conductivity type between the first surface and the first doped region and third doped regions of the first conductivity type between the second doped regions.

The present disclosure additionally relates to a semiconductor component comprising an SiC semiconductor body having an active region and an edge termination structure at least partly surrounding the active region, wherein in the SiC semiconductor body a drift zone of a first conductivity type is formed. The edge termination structure comprises a first doped region of a second conductivity type between a first surface of the SiC semiconductor body and the drift zone. The first doped region at least partly surrounds the active region and is spaced apart from the first surface. The edge termination structure furthermore comprises a plurality of second doped regions of the second conductivity type between the first surface and the first doped region and third doped regions between the second doped regions.

Further features and advantages of the subject matter disclosed will be apparent to the person skilled in the art upon reading the following detailed description and upon consideration of the drawings.

BRIEF DESCRIPTION OF THE DRAWINGS

The accompanying drawings convey a deeper understanding of the invention, are included in the disclosure and form a part thereof. The drawings illustrate embodiments of the present invention and together with the description set out the principles of the invention. Further embodiments of the invention and intended advantages emerge from the understanding of the following detailed description.

FIG. 1A is a schematic plan view of an SiC semiconductor body of a semiconductor component comprising an edge termination structure having a buried first doped region and a plurality of second doped regions spaced apart from one another between a first surface and the first doped region in accordance with one embodiment with third regions of the opposite conductivity type between second doped regions formed in ring-like fashion.

FIG. 1B is a schematic cross section through the semiconductor component from FIG. 1A along the line B-B.

FIG. 2A is a schematic plan view of an SiC semiconductor body of a semiconductor component comprising an edge termination structure having a buried first doped region and a plurality of second doped regions spaced apart from one another between a first surface and the first doped region in accordance with one embodiment with third regions—differentiable from the second regions—of the same conductivity type between the second doped regions.

FIG. 2B is a schematic cross section through the semiconductor component from FIG. 2A along the line B-B.

FIGS. 11A-11F show vertical cross sections through portions of semiconductor components with the edge termination structure from FIG. 10 with different dopant doses for the edge termination structure in accordance with further embodiments.

FIGS. 12A-12F show the distribution of avalanche events in the semiconductor components in accordance with FIGS. 11A-11F.

FIGS. 13A-13F show the electric field distribution in the semiconductor components in accordance with FIGS. 11A-11F.

DETAILED DESCRIPTION

In the following detailed description, reference is made to the accompanying drawings, which form part of the disclosure and show specific exemplary embodiments for illustration purposes. It goes without saying that further exemplary embodiments exist and structural or logical changes can be made to the exemplary embodiments, without in so doing departing from what is defined by the patent claims. The description of the exemplary embodiments is non-limiting in this respect. In particular, elements of exemplary embodiments described below can be combined with elements of others of the exemplary embodiments described, provided that nothing to the contrary is evident from the context.

The terms "have", "contain", "encompass", "comprise" and the like hereinafter are open terms which on the one hand indicate the presence of the stated elements or features, and on the other hand do not exclude the presence of further elements or features. The indefinite articles and the definite articles encompass both the plural and the singular, provided that nothing to the contrary is clearly evident from the context.

Some figures represent relative dopant concentrations by the indication "–" or "+" next to the doping type. By way of example, "n–" denotes a dopant concentration which is less than the dopant concentration of an "n"-doped region, while an "n+"-doped region has a higher dopant concentration than the "n"-doped region. The indication of the relative dopant concentration does not mean that doped regions with the same relative dopant concentration indication must have the same absolute dopant concentration, unless stated otherwise. By way of example, two different "n"-doped regions can have the same or different absolute dopant concentrations.

The term "electrically connected" describes a low-impedance connection between the electrically connected elements, for example a direct contact between the relevant elements or a connection via a metal and/or a highly doped semiconductor. The expression "electrically coupled" includes the fact that one or more intervening elements suitable for signal transmission can be present between the "electrically coupled" elements, e.g. elements which are controllable such that they can produce a low-impedance connection in a first state and a high-impedance decoupling in a second state.

Figure 1C:
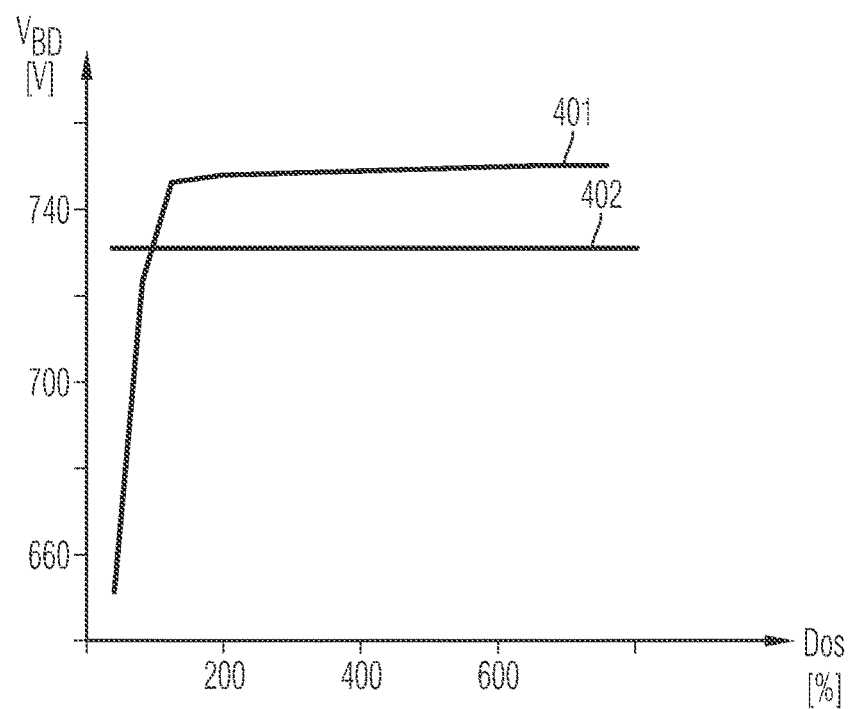
FIG. 1C is a schematic diagram for illustrating the dependence of the breakdown voltage of a semiconductor component according to FIGS. 1A and 1B as a function of a dopant dose in the edge termination structure.

FIGS. 1A to 1C show a semiconductor component 500 comprising a central active region 610 and comprising an edge termination region 690 enclosing the active region 610 on all sides. An element structure 601 determining the functionality of the semiconductor component 500 is formed in the active region 610. The element structure 601 can comprise for example a multiplicity of transistor cells TC, a pn junction of a pn diode or an MPS structure. The semiconductor component 500 can be a pn diode, an MPS diode, an IGBT (insulated gate bipolar transistor) or an IGFET (insulated gate field effect transistor), for example a MOSFET (metal oxide semiconductor FET), wherein the abbreviation MOSFET encompasses not only FETs having a metallic gate electrode but also FETs having a gate electrode composed of a semiconductor material. The semiconductor component 500 can also be an MGD (MOS-gated diode) or a semiconductor component which also comprises further electronic elements besides transistor cells TC.

The semiconductor component 500 is based on an SiC semiconductor body 100 composed of monocrystalline silicon carbide (SiC), for example 2H SiC (SiC of the 2H polytype), 6H SiC or 15R SiC. In accordance with one embodiment, the material of the SiC semiconductor body 100 is 4H SiC. A first surface 101 on the front side of the SiC semiconductor body 100 is planar or ribbed. A normal 104 to a planar first surface 101 or to a central plane of a ribbed first surface 101 defines a vertical direction. Directions parallel to a planar first surface 101 or to the central plane of a ribbed first surface 101 are horizontal or lateral directions.

On the rear side the SiC semiconductor body 100 has a second surface 102 parallel to the first surface 101. The total thickness of the SiC semiconductor body 100 between the first and second surfaces 101, 102 can be in the range of hundreds of nanometres to hundreds of micrometres. A side surface 103 forms the lateral outer surface of the SiC semiconductor body 100 and connects the first surface 101 to the second surface 102. The side surface 103 can be oriented orthogonally to the first surface 101.

A drift structure 130 is formed in the SiC semiconductor body 100, said drift structure comprising at least one highly doped contact section 139 along the second surface 102 and a weakly doped drift zone 131 of a first conductivity type between the first surface 101 and the highly doped contact section 139. Besides the drift zone 131 and the contact section 139, the drift structure 130 can comprise even further doped regions of the conductivity type of the drift zone 131 or of the opposite conductivity type.

The edge termination region 690 is adjacent to the side surface 103 of the SiC semiconductor body 100 and comprises none of the semiconductor elements, for example transistor cells, that determine the functionality of the semiconductor component. Instead, an edge termination structure 190 for lateral field reduction is formed in the edge termination region 690. Besides the edge termination structure 190 for lateral field reduction, the edge termination region 690 can comprise further edge structures having doped regions, for example a channel stopper region of the conductivity type of the drift zone 131, which is more highly doped than the drift zone 131 and which can extend between the edge termination structure 190 and the side surface 103 from the first surface 101 into the SiC semiconductor body 100.

The edge termination structure 190 comprises a first doped region 191 of a second conductivity type, which is complementary to the first conductivity type of the drift zone 131. The first doped region 191 is formed between the first surface 101 and the drift zone 131 and together with the drift structure 130, for example with the drift zone 131, forms a pn junction extending predominantly or completely parallel to the first surface 101. A vertical extent of the first doped region 191 can be in the range of 500 nm to 2.5 µm, for example in a range of 0.8 µm to 1.2 µm. A distance between the first doped region 191 and the first surface 101 can be between 100 nm and 1 µm. In a lateral direction and parallel to outer edges of the active region 610, the dopant concentration is largely constant, at least in straight sections. In a lateral direction and orthogonally to outer edges of the active region 610, the dopant concentration in the second doped regions 192 can be almost constant over a wide region, e.g. over at least 90% of a lateral width w1 of the second doped regions 192.

The first doped region 191 is fully depletable of mobile charge carriers under conditions specified in a data sheet for the semiconductor component 500 within the operating and ambient conditions within the maximum limiting data in off-state operation. By way of example, the dopant dose for the first doped region 191 is in a range of $2 \times 10^{12}$ cm$^{-2}$ to $2 \times 10^{13}$ cm$^{-2}$, for example in a range of $6 \times 10^{12}$ cm$^{-2}$ to $10^{13}$ cm$^{-2}$.

The edge termination structure 190 furthermore comprises second doped regions 192, which are laterally spaced apart from one another and in each case at least partly enclose the active region 610. In accordance with one embodiment, at least one of the second doped regions 192 forms a closed structure that completely encloses the active region 610. Other second doped regions 192 can be formed along lines that laterally frame the active region 610, wherein the second doped regions 192 are spaced apart from one another along the lines. In accordance with the embodiment in FIG. 1A, all the second doped regions 192 form closed structures that in each case completely enclose the active region 610.

The second doped regions 192 are formed between the first surface 101 and the first doped region 191 and can adjoin for example the first surface 101, the first doped region 191, or both. In accordance with one embodiment, the second doped regions 192 extend from the first surface 101 as far as the first doped region 191. A dopant dose for the second doped regions 192 is higher than a dopant dose for the first doped region 191, for example at least four times higher. In accordance with one embodiment, the dopant concentration of the second doped regions 192 is at least $1 \times 10^{17}$ cm$^{-3}$.

The total dopant dose of the edge termination structure 190 comprising the first doped region 191 and the second doped regions can be in a range of $2 \times 10^{13}$ cm$^{-2}$ to $6 \times 10^{13}$ cm$^{-2}$, for example in a range of $3 \times 10^{15}$ cm$^{-2}$ to $5 \times 10^{13}$ cm$^{-2}$.

Third doped regions 193 of the first conductivity type separate adjacent second doped regions 192 from one another in a lateral direction.

The first doped region 191 and the innermost second doped region 192 facing the active region 610 can be directly adjacent to doped regions of the same conductivity type that are formed within the active region 610. A vertical extent of the edge termination structure 190 can be at least 80% of a distance between the first surface 101 and a lower edge of the deepest doped region of the second conductivity type within the active region 610.

In the off-state case, the second doped regions 192 contribute to the reduction of the electric field in a lateral direction. The comparatively weakly doped first doped region 191 shields the still relatively steep lateral pn junctions in silicon carbide between the second doped regions 192 and the third doped regions 193 towards the bottom and in this way reduces the maximum field strength occurring at the lateral pn junctions in the edge termination structure 190. The buried first doped region 191 thus enables, inter alia, higher dopant doses in the second doped regions 192, such that the influence of charge carriers that may occupy surface states along an interface between the SiC semiconductor body 100 and a passivation structure bearing on the first surface 101 is reduced. The dielectric strength of the edge termination structure 190 thus remains independent of the operating environment and constant over a longer operating duration.

In this case, the passivation structure can consist of a layer composed of a dielectric material or comprise a plurality of layers composed of different dielectric materials, e.g. a silicon oxide produced from an oxidation of silicon carbide, deposited silicon oxide, a silicon oxide containing nitrogen, a glass, for example USG (undoped silicate glass), BSG (borosilicate glass), PSG (phosphosilicate glass) or BPSG (borophosphosilicate glass), or a polyimide.

In comparison with edge termination structures that only comprise weakly doped ring structures of the second conductivity type, for the production of which only one lithographic mask plane is used, the edge termination structure 190 is significantly less sensitive to lithography fluctuations, i.e. with regard to variations of the distances between the second doped regions 192. Moreover, owing to the shielding effect of the first doped region 191, significantly lower field strengths occur at the lateral pn junctions, which has a positive effect on stability and reliability of the semiconductor component and improves the scalability to semiconductor components for higher voltage classes.

By comparison with edge termination structures which are based on a multi-zone implantation with a continuous, near-surface edge termination region of the second conductivity type and in which the dopant concentration in the zones decreases as the distance between the zones and the active region increases, the edge termination structure 190 can be produced with fewer mask planes, e.g. if the production of the first and second doped regions 191, 192 can be linked with the formation of doped regions of the same conductivity type within the active region 610.

FIG. 1C shows the dependence of the breakdown voltage VBD of the edge termination structure 190 on the dopant dose Dos for the first doped regions 191 for a semiconductor component comprising an edge termination region 610 defined for a reverse voltage of 650 V.

The line 401 represents the dependence of the breakdown voltage VBD on the dopant dose Dos of the first doped regions. The line 402 indicates the breakdown voltage within the active region 610. The scaling of the abscissa relates to the ratio in percent of the dopant dose in the first doped regions 191 to a constant reference dose of $4 \times 10^{12}$ cm$^{-2}$.

The diagram shows that the edge termination structure 190 permits a very wide process window for the dopant dose for the second doped regions 192 and the breakdown voltage of the edge termination structure 190 is therefore largely independent of process fluctuations with regard to the edge termination structure 190. The avalanche breakdown of the semiconductor component 500 is thus reliably bound to the active region 610, which significantly improves the stability of the semiconductor component 500 and the avalanche robustness thereof. In the active region 610 the avalanche breakdown can then be pinned for example to curvatures of doped regions of the second conductivity type that are formed there.

Figure 1D:
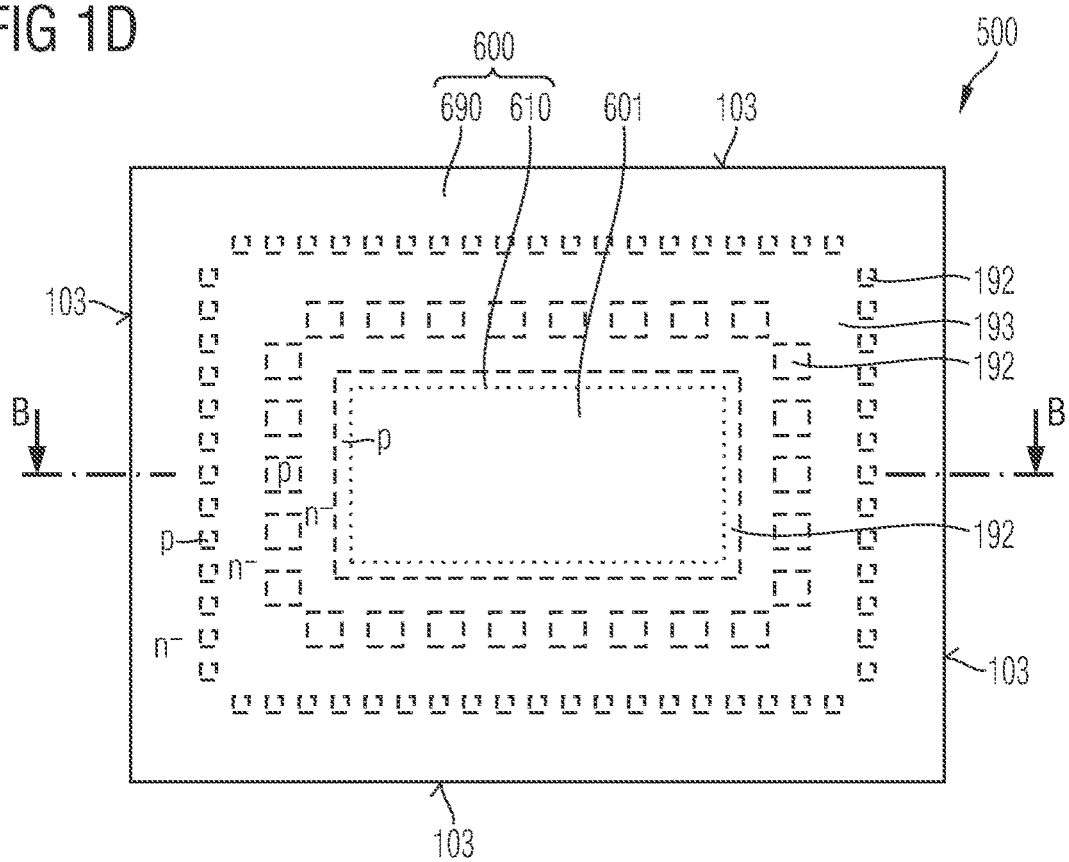
FIG. 1D is a schematic plan view of an SiC semiconductor body of a semiconductor component comprising an edge termination structure having a buried first doped region and a plurality of second doped regions spaced apart from one another between a first surface and the first doped region in accordance with one embodiment with second doped regions formed in columnar fashion, which are separated by third regions of the opposite conductivity type.

FIG. 1D shows second doped regions 192 formed in columnar fashion and formed along straight frame lines framing the active region 610. Doped second regions 192 lying on the same frame line are separated from one another by further third doped regions 193.

In accordance with the embodiment in FIGS. 2A and 2B, the third doped regions 193 of the edge termination structure 190 are of the same conductivity type as the second doped regions 192 and the first doped region 191, wherein a dopant dose in the second doped regions 192 is higher than that in the third doped regions 193. In accordance with one embodiment, the dopant dose in the second doped regions 192 is at least four times the dopant dose in the first doped region 191. In accordance with a further embodiment, the dopant concentration in the third doped regions 193 can approximately correspond to the dopant concentration in the first doped region 191, that is to say can deviate from the dopant concentration in the first doped region 191 by not more than a maximum of 10% of the value of said dopant concentration.

By comparison with JTE structures which comprise alternately more highly and more weakly doped rings and in which the width of the more highly doped rings decreases with increasing distance from the active region 610 and the width of the more weakly doped rings increases to the same extent, the edge termination structure 190 according to FIGS. 2A to 2B proves to be more robust vis-à-vis lithography fluctuations, for example in the case of relatively low voltage classes of, for example, 650 V or 1200 V.

Figure 3:
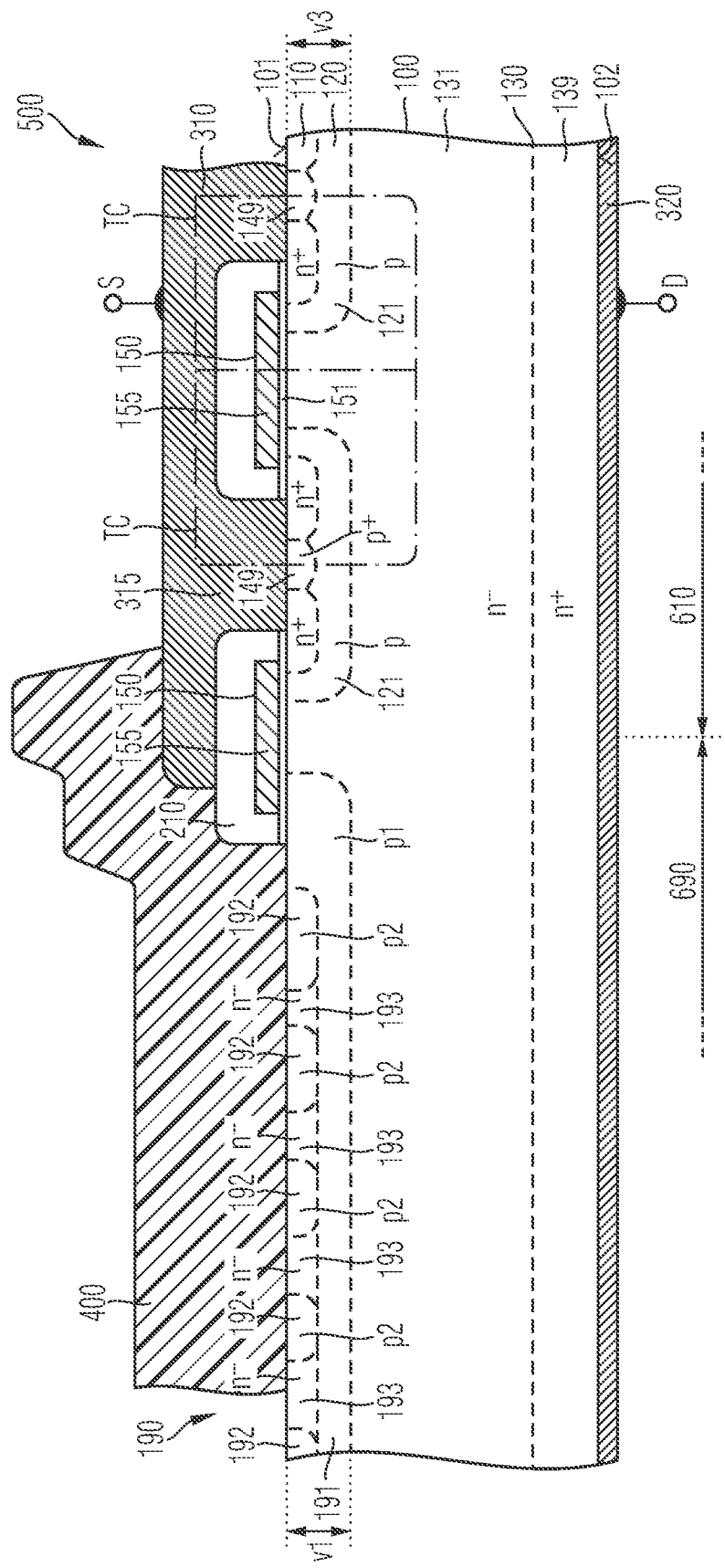
FIG. 3 is a schematic vertical cross section through a portion of a semiconductor component with edge termination structure in accordance with one embodiment concerning semiconductor components comprising transistor cells having planar gate structures.

FIG. 3 shows a semiconductor component 500 comprising an SiC semiconductor body 100 having an edge termination region 690 enclosing a central active region 610 with transistor cells TC. Planar gate structures 150 of the transistor cells TC are formed on the front side of the SiC semiconductor body 100, wherein at least in the interior of the active region 610 an individual gate structure 150 is assigned in each case to two transistor cells TC formed symmetrically with respect to the gate structure 150.

The gate structures 150 comprise a conductive gate electrode 155 and a gate dielectric 151, which is formed directly on the first surface 101 and separates the gate electrode 155 from the SiC semiconductor body 100. A body region 120 extending from the first surface 101 into the SiC semiconductor body 100 is assigned in each case to two adjacent transistor cells TC, which for their part are assigned to two adjacent gate structures 150. Source regions 110 of the two adjacent transistor cells TC are formed between the first surface 101 and the body region 120. The body region 120 can comprise a contact region 149, in which the dopant concentration is higher than in a main region 121 of the body region 120 outside the contact region 149. The contact region 149 adjoins the first surface 101 between the two source regions 110.

A drift structure 130 having a drift zone 131 and a contact section 139 separates the transistor cells TC from a second surface 102 of the SiC semiconductor body 100, wherein the drift structure 130, for example the drift zone 131 or current spreading zones having the same conductivity type as the drift zone 131 but a higher dopant concentration than the drift zone 131, can extend between adjacent body regions 120 and below the gate electrodes 155 to the first surface 101.

In the switched-on state, the transistor cells TC form lateral inversion channels in channel regions of the body regions 120 along the gate dielectric 151, said inversion channels connecting the source regions 110 to the sections of the drift structure 130 that adjoin the first surface 101, for example to the drift zone 131 or the current spreading zones.

An interlayer dielectric 210 separates the gate electrode 155 from a first load electrode 310 on the front side of the SiC semiconductor body 100. Contact structures 315 extending through openings in the interlayer dielectric 210 electrically connect the first load electrode 310 to the contact regions 149 and to the source regions 110. A second load electrode 320 can adjoin the highly doped contact section 139 of the drift structure 130. The gate electrode 155 is electrically connected or coupled to a gate terminal of the semiconductor component.

In the exemplary embodiment depicted, the semiconductor component 500 is an n-channel SiC MOSFET. The first conductivity type is the n type and the second conductivity type is the p type. The first load electrode 310 can form a source terminal S or be electrically connected to a source terminal S. The second load electrode 320 can form a drain terminal D or be electrically connected to such a terminal. In accordance with other embodiments, the first conductivity type is the p type, and the second conductivity type is the n type.

An edge termination structure 190 as described above is formed in the edge termination region 690. The first doped region 191 can extend to below the outermost gate structures 150 or be laterally spaced apart therefrom. A lateral width of the second doped regions 192 can decrease with increasing distance from the active region 610. In addition or as an alternative thereto, a lateral width of the third doped regions 193 can increase with increasing distance from the active region 610.

A dielectric passivation structure, for example a polyimide structure 400, can bear directly on at least one section of the first surface 101 in the edge termination region 690, which structure can cover outer edges of the first load electrode 310 or of the outermost gate structure 150. In accordance with another embodiment, in at least one inner partial region of the edge termination region 690 that is adjacent to the active region 610, the interlayer dielectric 210 can separate the polyimide structure 400 from the SiC semiconductor body 100. At least one further dielectric layer, for example a silicon oxide layer and/or a layer composed of a silicate glass, can be formed at least in sections between the polyimide structure 400 and the SiC semiconductor body 100.

Surface states at the interface between the SiC semiconductor body 100 and the passivation structure, for example the polyimide structure 400, and at the interface between the SiC semiconductor body 100 and an interlayer dielectric 210 can be occupied by charge carriers to different extents during the operation of the semiconductor component 500, which charge carriers can influence the electric field distribution in the edge termination region 610 and the breakdown voltage of the edge termination structure 190. In accordance with one embodiment, the dopant concentration in the second doped regions 192 is at least $1 \times 10^{17}$ cm$^{-3}$, for example at least $2 \times 10^{17}$ cm$^{-3}$, such that charge carriers which at least temporarily occupy the surface states at the boundary layer between the polyimide structure 400 and the SiC semiconductor body 100 have only a small influence on the dielectric strength of the edge termination region 690.

In accordance with one embodiment, the dopant dose in the second doped regions 192 is approximately equal to the dopant dose in the contact regions 149 or approximately equal to the difference between the dopant concentration in the contact regions 149 and in the body region 120, such that the second doped regions 192 and the contact regions 149 can be defined in the same implantation step and in the same mask plane.

The doping of the first doped regions 191 is chosen such that the first doped regions 191 are fully depletable during the operation of the semiconductor component 500. Since the doping of the body regions 120 is chosen such that the body regions 120 are not depleted, the formation of the body regions 120 usually comprises at least one method step that is independent of the formation of the first doped regions 191.

A vertical extent v1 of the first doped region 191 in the edge termination region 690 can correspond to a distance v3 between a lower edge of the body regions 120 and the first surface 101 or be at least 80%, e.g. at least 85%, of the distance v3, which in this exemplary embodiment corresponds to the vertical extent of the body regions 120 comprising the contact regions 149, as a result of which a dip in the blocking capability at the junction between the body region 120 and the edge termination structure 190 can be avoided.

Figure 4:
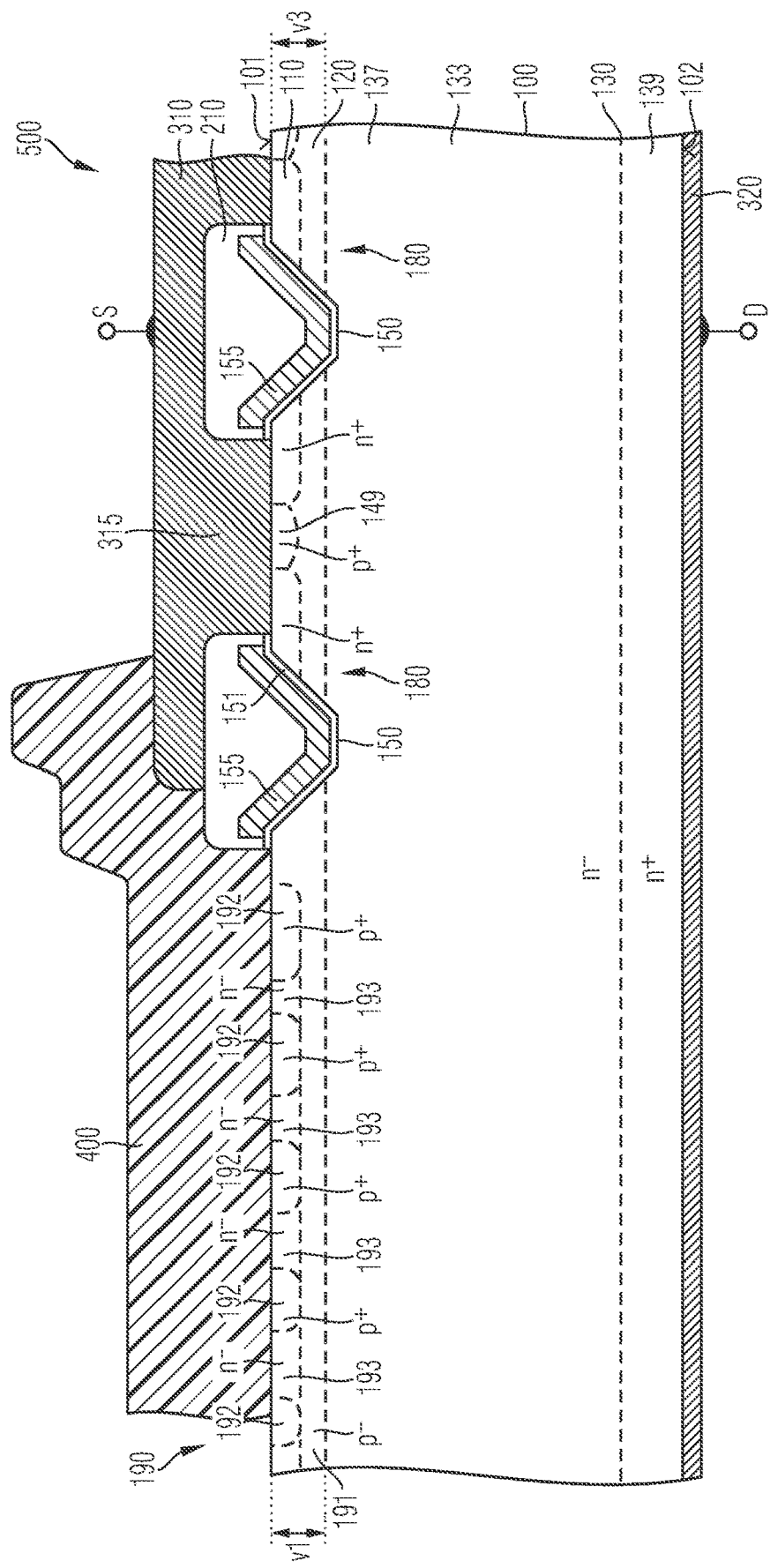
FIG. 4 is a schematic vertical cross section through a portion of a semiconductor component with edge termination structure in accordance with one embodiment concerning semiconductor components comprising transistor cells having shallow trench gate structures and a transistor channel on both sides.

The semiconductor component 500 in FIG. 4 is an SiC TMOSFET (SiC Trench MOSFET) comprising gate structures 150 formed in shallow trenches having an approximately v-shaped vertical cross-sectional area. The gate electrode 155 can extend with approximately uniform layer thickness along sidewalls and along the bottom of the gate structures 150. Mesa sections 180 of the SiC semiconductor body 100 between adjacent gate structures 150 comprise source regions 110 formed along the first surface 101 and body regions 120 that separate the source regions 110 from a drift structure 130. The body regions 120 can comprise a more highly doped contact region 149, in which the dopant concentration is higher than in a main region 121 of the body regions 120 outside the contact region 149. The sidewalls of the mesa sections 180 can be for example (0-33-8) lattice planes.

The SiC TMOSFET comprises a drift structure 130 and an edge termination structure 190 as described above. A vertical extent v1 of the edge termination structure 190 can be at least 80% of a distance v3 between a lower edge of the body regions 120 and the first surface 101 or be e.g. approximately equal to the distance v3, wherein in the exemplary embodiment in FIG. 4 the distance v3 corresponds to the vertical extent of the body regions 120 comprising the contact regions 149.

Figure 5:
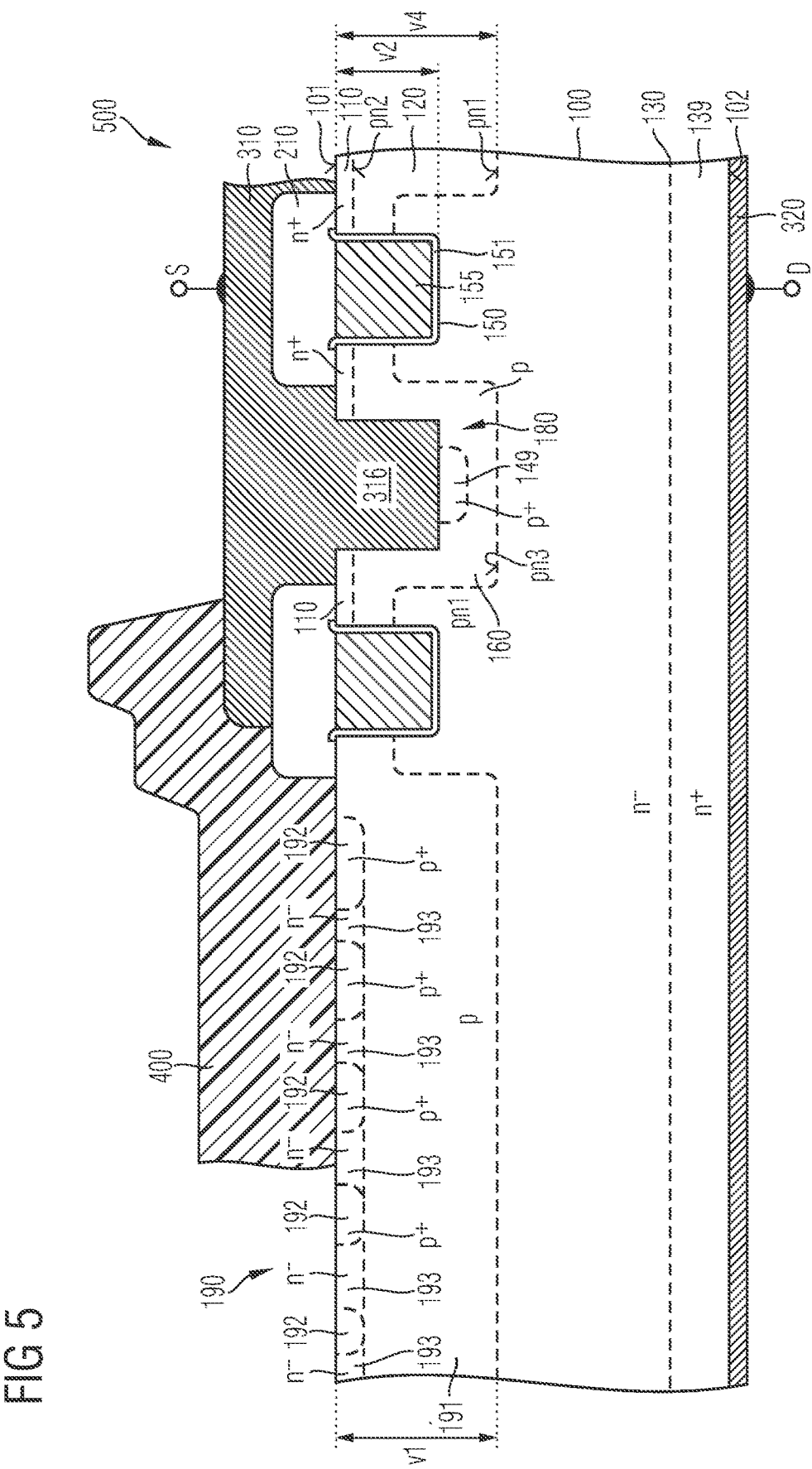
FIG. 5 is a schematic vertical cross section through a portion of a semiconductor component with edge termination structure in accordance with one embodiment concerning semiconductor components comprising transistor cells having deep trench gate structures and transistor channels on both sides of the trench gate structures.

The semiconductor component 500 in FIG. 5 is an SiC TMOSFET comprising gate structures 150 extending from a first surface 101 into an SiC semiconductor body 100, wherein sidewalls of the gate structures 150 extend vertically to the first surface 101. Body regions 120 are formed in mesa sections 180 of the SiC semiconductor body 100 between adjacent gate structures 150, said body regions forming, in the mesa sections 180, first pn junctions pn1 with a drift structure 130 and second pn junctions pn2 with source regions 110 formed along the first surface 101. Side surfaces of the mesa sections 180 are main lattice planes of the silicon carbide crystal.

Between adjacent gate structures 150, trench contacts 316 extend from the first load electrode 310 through an interlayer dielectric 210 and into the mesa sections 180. The trench contacts 316 laterally adjoin the source regions 110 and connect the latter to the first load electrode 310.

The transistor cells TC additionally comprise shielding regions 160 of the conductivity type of the body regions 120, wherein a distance v4 between a lower edge of the shielding regions 160 and the first surface 101 is greater than a vertical extent v2 of the gate structures 150. The shielding regions 160 can have a higher dopant concentration than the body regions 120 and are laterally spaced apart from the gate structures 150. The gate structures 150 are shielded against the drain potential by in each case two adjacent shielding regions 160, which are significantly closer to the second surface 102 than the gate structures 150. Within the active region 610, it is possible to pin the avalanche breakdown in the region of the shielding regions 160, for example along the lower edges of the shielding regions 160. The shielding regions 160 can comprise highly doped contact regions 149 formed directly below the trench contacts 316.

An edge termination region 690 of the semiconductor component 500 comprises an edge termination structure 190 as described above. In this case, a vertical extent v1 of the edge termination structure 190 can correspond approximately to the distance v4 between the lower edge of the shielding regions 160 and the first surface 101, for example can be at least 80% thereof. If the contact regions 149 are introduced through the bottom of contact trenches before the formation of the trench contacts 316, then the second doped regions 192 can be formed from the same implantations and in the same mask plane as the highly doped contact regions 149, wherein an absolute dopant concentration of the second conductivity type in the second doped regions 192 can correspond approximately to the difference between the dopant concentration of the contact region 149 and of the shielding region 160.

Figure 6:
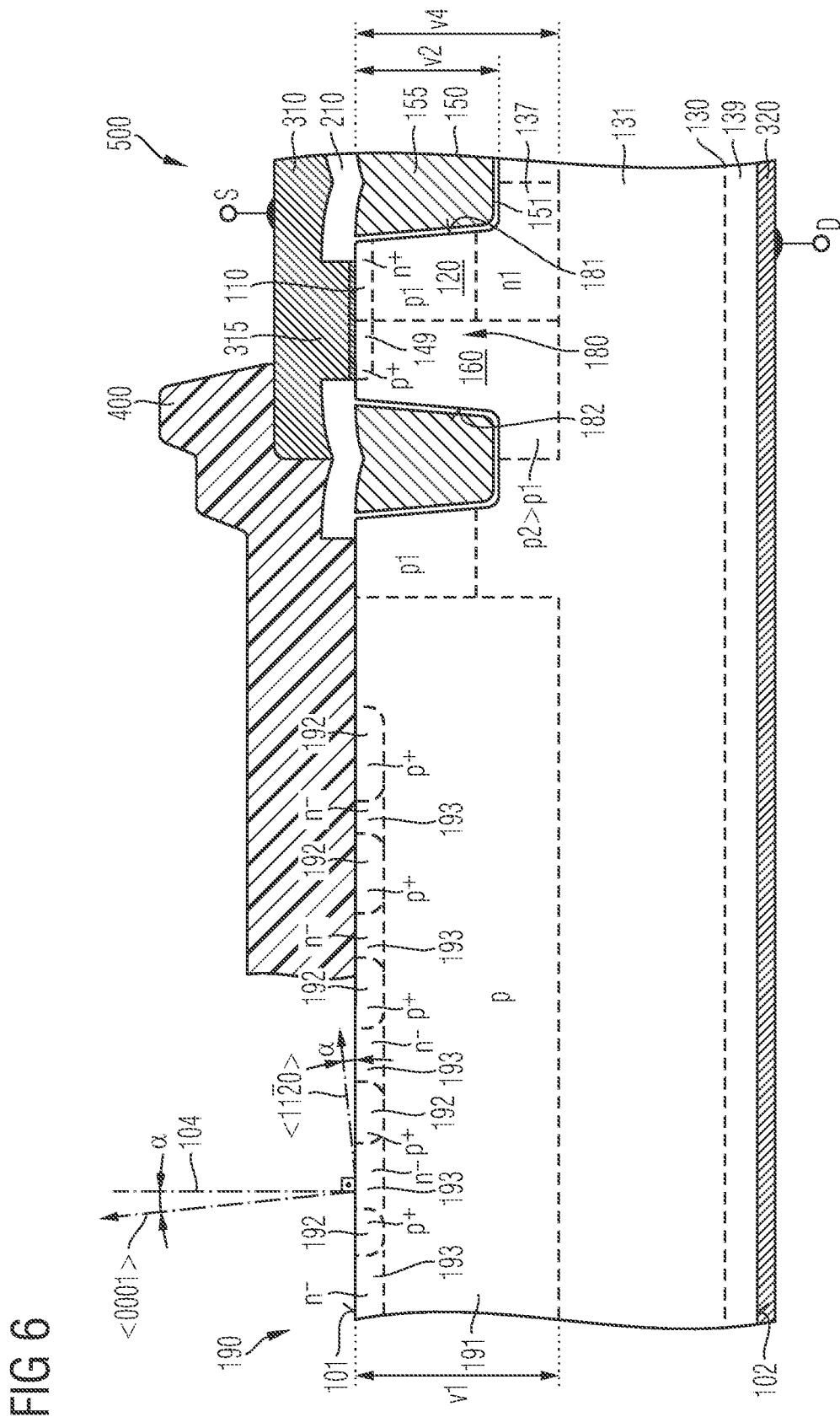
FIG. 6 is a schematic vertical cross section through a portion of a semiconductor component with edge termination structure in accordance with one embodiment concerning semiconductor components comprising transistor cells having deep trench gate structures and a transistor channel on one side.

In FIG. 6, the semiconductor component 500 is an n-channel SiC TMOSFET based on an SiC semiconductor body 100 having strip-like transistor cells TC and deep trench gate structures 150 with a transistor channel on one side. For details of the edge termination structure 190 that are not described below, reference is made to the description concerning FIGS. 1A and 1B.

On a front side the SiC semiconductor body 100 has a first surface 101, which can comprise coplanar surface sections. The first surface 101 can coincide with a main lattice plane or extend at an angle deviation α obliquely with respect to a main lattice plane, e.g. with respect to the (0001) lattice plane, wherein the angle deviation can be at most 12°, e.g. approximately 4°.

In the embodiment illustrated, the <0001> crystal direction is tilted by an angle deviation α with respect to the normal 104. The <11-20> crystal direction is tilted by the same angle deviation α with respect to the horizontal plane and otherwise extends in the cross-sectional plane. The <1-100> crystal direction is orthogonal to the cross-sectional plane.

On the rear side the SiC semiconductor body 100 has a second surface 102 parallel to the first surface 101. A total thickness of the SiC semiconductor body 100 between the first surface 101 and the second surface 101, 102 can be from hundreds of nanometres to hundreds of micrometres.

A drift structure 130 formed in the SiC semiconductor body 100 comprises at least one highly doped contact section 139 adjoining the second surface 102, and a weakly doped drift zone 131 of a first conductivity type between the first surface 101 and the highly doped contact section 139.

The highly doped contact section 139 is of the same conductivity type as the drift zone 131 and can be or comprise a substrate section sawn from a crystal or sliced from a crystal or may have resulted completely from an epitaxy method. The contact section 139 forms an ohmic contact with a second load electrode 320, which can directly adjoin the second surface 102. Along the second surface 102 the dopant concentration in the contact section 139 is high enough to form a low-impedance contact with the second load electrode 320.

The drift zone 131 can be formed in a layer grown on the contact section 139 by epitaxy. An average dopant concentration in the drift zone 131 is in a range of $5 \times 10^{14}$ cm$^{-3}$ to $5 \times 10^{16}$ cm$^{-3}$, for example. Besides the drift zone 131 and the contact section 139, the drift structure 130 can comprise further doped regions, for example field stop zones, blocking or barrier zones and/or current spreading zones of the conductivity type of the drift zone 131 and/or island-like regions of the complementary conductivity type.

The transistor cells TC on the front side of the SiC semiconductor body 100 are formed along gate structures 150 extending from the first surface 101 into the SiC semiconductor body 100, wherein mesa sections 180 of the SiC semiconductor body 100 separate adjacent gate structures 150 from one another.

A longitudinal extent of the gate structures 150 along a first horizontal direction is greater than a width of the gate structures 150 along a second horizontal direction orthogonal to the first horizontal direction and transverse with respect to the longitudinal extent. The gate structures 150 can be long trenches extending from one side of an active region 610 having the transistor cells TC as far as an opposite side, wherein the length of the gate structures 150 can be up to hundreds of micrometres or up to a number of millimetres.

In accordance with other embodiments, the gate structures 150 can be formed along parallel lines extending in each case from one side of the cell array region to the opposite side, and wherein a multiplicity of gate structures 150 separated from one another are formed in each case along the same line. The gate structures 150 can also form a lattice with the mesa sections 180 in the meshes of the lattice.

The gate structures 150 can be uniformly spaced apart from one another, can have the same width and can form a regular pattern, wherein a centre-to-centre distance between the gate structures 150 can be in a range of 1 μm to 10 μm, e.g. of 2 μm to 5 μm. A vertical extent of the gate structures 150 can be 300 nm to 5 μm, e.g. in a range of 500 nm to 2 μm.

Sidewalls of the gate structures 150 are slightly tilted with respect to the vertical direction, wherein mutually opposite sidewalls can extend parallel to one another or towards one another. In accordance with one embodiment, the width of the gate structures 150 decreases with increasing distance from the first surface 101. By way of example, one sidewall deviates by the angle deviation α and the other sidewall by −α from the vertical.

The mesa sections 180 have two opposite longitudinal mesa side surfaces 181, 182, which directly adjoin two adjacent gate structures 150. A first mesa side surface 181 lies in the (11-20) lattice plane, in which the charge carrier mobility is high. The second mesa side surface 182 situated opposite the first mesa side surface 181 can be tilted by double the angle deviation α, for example by approximately 8 degrees, with respect to the relevant lattice plane.

The gate structures 150 comprise a conductive gate electrode 155, which can comprise a highly doped polycrystalline silicon layer, an integral or multipartite metal structure or both. The gate electrode 155 is electrically connected to a gate metallization on the component front side, which forms a gate terminal or is electrically connected or coupled to such a terminal.

Along at least one side of the gate structure 150, a gate dielectric 151 separates the gate electrode 155 from the SiC semiconductor body 100. The gate dielectric 151 can comprise a semiconductor dielectric, for example a thermally grown or deposited semiconductor oxide, e.g. silicon oxide, a semiconductor nitride, for example a deposited or thermally grown silicon nitride, a semiconductor oxynitride, for example a silicon oxynitride, some other deposited dielectric material or an arbitrary combination of the materials mentioned. The layer thickness of the gate dielectric 151 can be tens of nanometres and can be chosen such that a threshold voltage of the transistor cells TC is in a range of 1 V to 8 V.

The gate structures 150 can exclusively comprise the gate electrode 155 and the gate dielectric 151 or can comprise further conductive and/or dielectric structures, e.g. isolating dielectrics, in addition to the gate electrode 155 and the gate dielectric 151.

In the mesa sections 180, source regions 110 are formed towards the front side of the SiC semiconductor body 100, which source regions can directly adjoin the first surface 101 and the first mesa side surface 181 of the respective mesa section 180. In this case, each mesa section 180 can comprise a source region 110 having sections connected to one another in the SiC semiconductor body 100 or having at least two sections which are separated from one another in the SiC semiconductor body 100 and which are connected to one another with low impedance by way of a contact or trench contact adjoining the mesa section 180.

The mesa sections 180 furthermore comprise body regions 120 that separate the source regions 110 from the drift structure 130 and adjoin the first mesa side surface 181. The body regions 120 form first pn junctions pn1 with the drift structure 130 and second pn junctions pn2 with the source regions 110. In the switched-on state of the transistor cell TC, an inversion channel connecting the source region 110 to the drift structure 130 is formed in the body region 120 along the gate structure 150. An extent of the body regions 120 along the first mesa side surface 181 corresponds to a channel length of the transistor cells TC and can be 200 nm to 1500 nm.

The mesa sections 180 additionally comprise at least partial regions of shielding regions 160 of the conductivity type of the body regions 120, wherein the shielding regions 160 can adjoin the second mesa side surfaces 182 and form an ohmic contact with the first load electrode 310. The shielding regions 160 or at least partial regions of the shielding regions 160 can be more highly doped than the body regions 120. By way of example, a dopant concentration p2 in the shielding regions 160 along the second mesa side surfaces 182 can be at least five times higher than a dopant concentration p1 in the body regions 120 along the first mesa side surfaces 181.

The shielding regions 160 are formed between the body regions 120 and the second mesa side surfaces 182 and can directly adjoin the body regions 120. A vertical extent of the shielding regions 160 can be greater than a vertical extent of the body regions 120, for example greater than a vertical extent of the gate structures 150. More highly doped contact regions 149 can be formed in the shielding regions 160, which contact regions can adjoin the contact structure 315 to the first load electrode 310. A partial region of a shielding region 160 can be formed directly between the bottom of the gate structure 150 and the second surface 102 and shield the gate structure 150 against the potential of the second load electrode 320.

A load current that flows through the SiC semiconductor body 100 between the first and second load electrodes 310, 320 in the switched-on state of the semiconductor component 500 passes through the body regions 120 as a minority charge carrier flow in inversion channels induced along the gate dielectric 151. The higher dopant concentration in the shielding regions 160 in comparison with the dopant concentration in the body regions 120 suppresses the formation of inversion channels along the second mesa side surfaces 182 during operation within the maximum limiting data.

FIG. 6 additionally shows current spreading zones 137 as part of the drift structure 130, wherein the current spreading zones 137 form the first pn junctions pn1 with the body regions 120 and directly adjoin the drift zone 131, and wherein a dopant concentration in the current spreading zones 137 is higher than in the drift zone 131, for example at least double the magnitude of that in said drift zone.

The vertical extent v1 of the edge termination region 190 can be at least 80%, e.g. at least 85%, of the vertical extent v4 of the shielding regions 160 comprising the contact regions 149 or be equal in magnitude.

Figure 7:
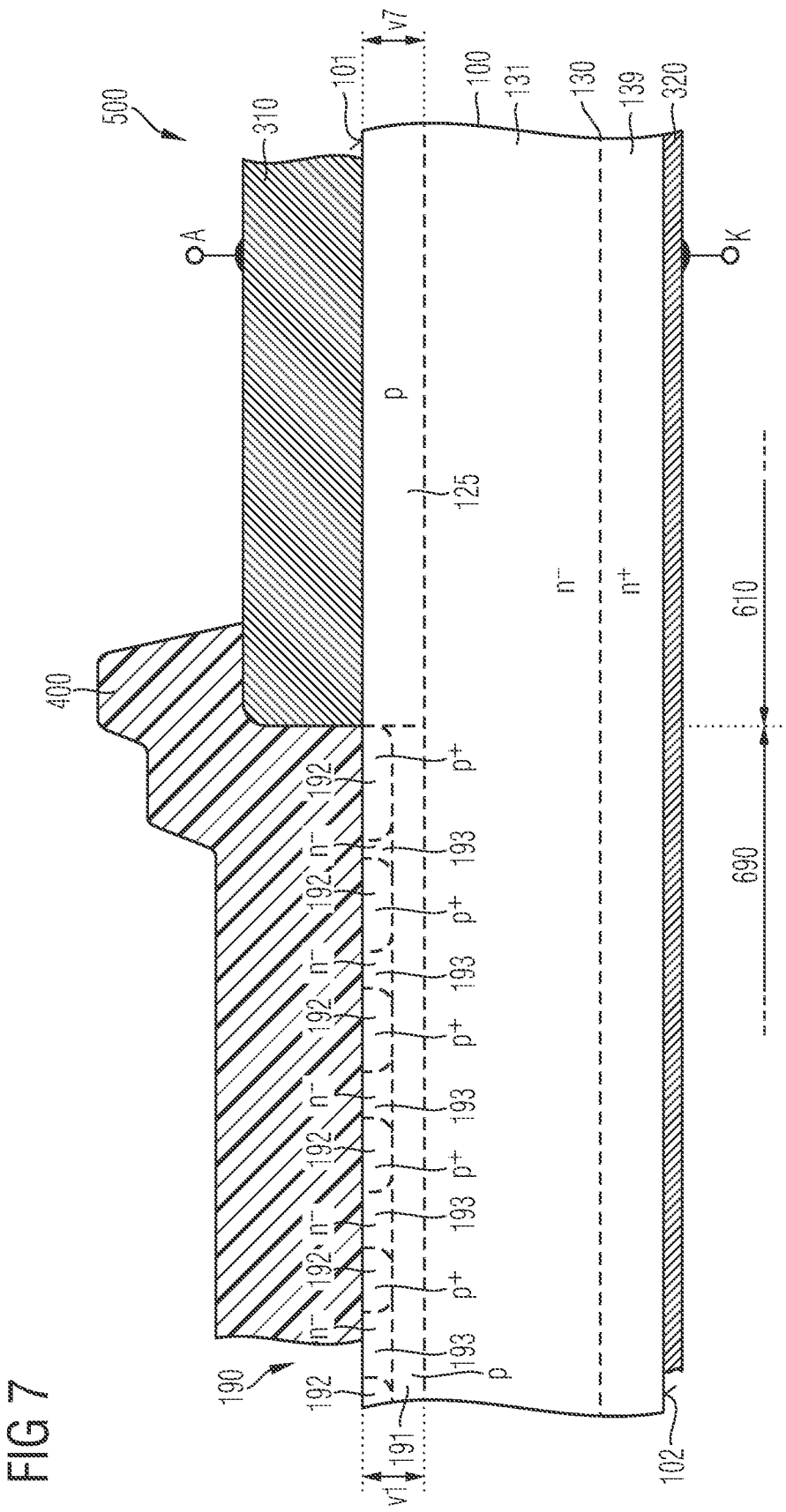
FIG. 7 is a schematic vertical cross section through a portion of a semiconductor component with edge termination structure in accordance with one embodiment concerning a pn diode.

The semiconductor component 500 in FIG. 7 is a pn diode, in the active region 610 of which a p-doped anode region 125 can be formed as continuous layer. The edge termination structure 190 can be directly adjacent to the anode region 125 laterally. A vertical extent v1 of the edge termination structure 190 is at least 80% of a vertical extent v7 of the anode region 125. In accordance with one embodiment, the vertical extent v1 of the edge termination structure 190 is equal to the vertical extent v7 of the anode region 125, such that a dip in the blocking capability at the junction between the edge termination structure 190 and the anode region 125 can be avoided.

Figure 8:
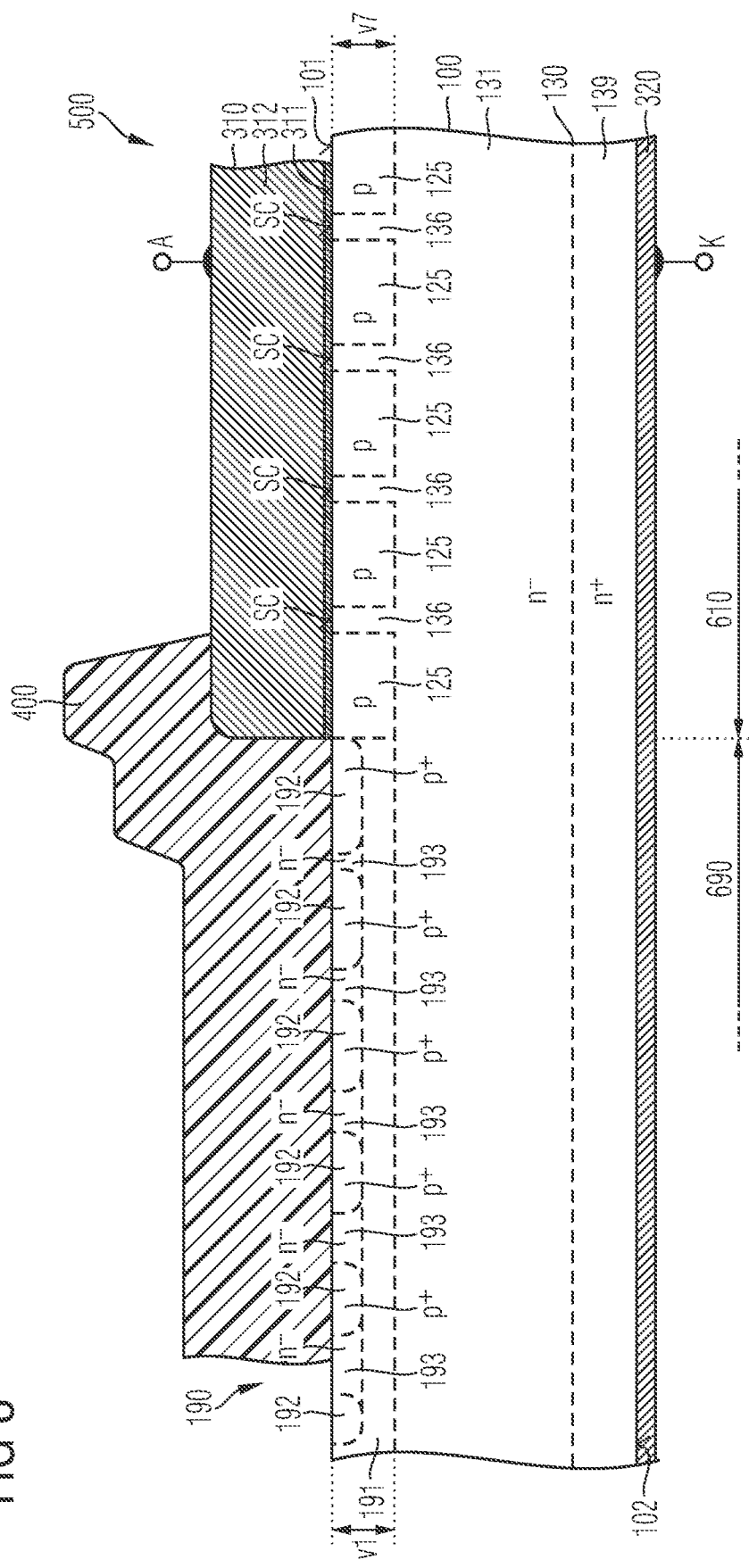
FIG. 8 is a schematic vertical cross section through a portion of a semiconductor component with edge termination structure in accordance with one embodiment concerning an MPS (merged pin Schottky) diode.

The semiconductor component 500 in FIG. 8 is an MPS diode, in which in the active region 610 channel sections 136 of the drift structure 130 extend as far as the first surface 101 and form Schottky contacts SC to the first load electrode 310. A dopant concentration in the channel sections 136 can be greater than or equal to the dopant concentration in the drift zone 131. Anode regions 125 of the second conductivity type that extend from the first surface 101 into the SiC semiconductor body 100 likewise adjoin the first load electrode 310. For a low load range, the MPS diode uses the lower forward voltage of the Schottky contacts SC, while the bipolar current via the pn junctions can increasingly contribute to higher load currents. In the off-state case, space charge zones extending from the anode regions 125 laterally into the channel sections 136 pinch off a leakage current path through the channel sections 136.

Figure 9A:
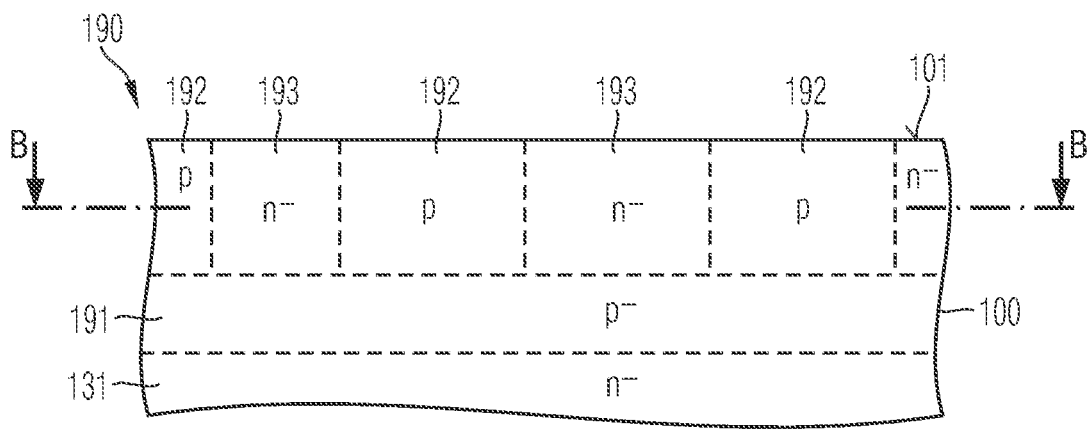
FIG. 9A is a schematic vertical cross section through a portion of a semiconductor component with edge termination structure having shallow lateral pn junctions between second and third doped regions.
Figure 9B:
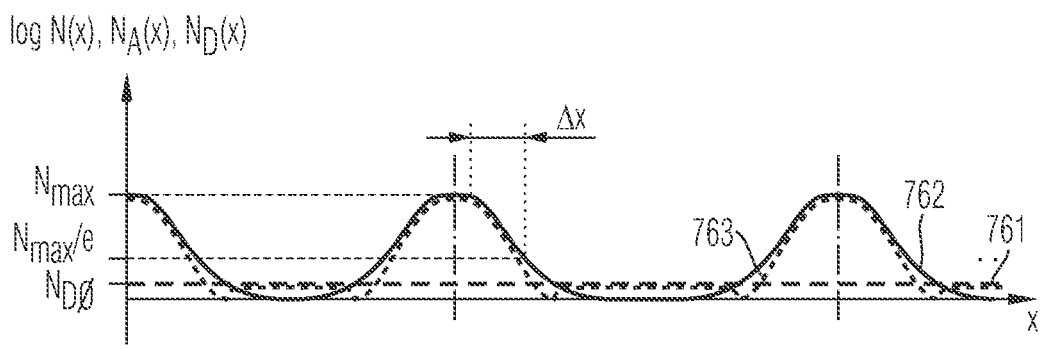
FIG. 9B is a schematic diagram for illustrating the lateral dopant distribution in the second and third doped regions of the edge termination structure from FIG. 9A along the line B-B for third doped regions of the opposite conductivity type of the second doped regions.

FIGS. 9A to 9B relate to the lateral dopant distribution in the second and third doped regions 192, 193 of the edge termination structures 190 as described in the previous figures, wherein a dopant concentration of dopants of the first conductivity type in the third doped regions 193 corresponds to the dopant concentration ND0 of the same dopant in the drift zone 131.

The second doped regions 192 and the third doped regions 193 have a constant background doping 761 of the conductivity type of the drift zone 131 with the dopant concentration ND0 in the drift zone 131. At least in edge sections of the second doped regions 192, the concentration 762 of dopants of the conductivity type opposite to the conductivity type of the drift zone 131 continuously decreases, such that along the same direction the net dopant concentration 763 falls within a lateral distance Δx of at least 200 nm, for example of at least 500 nm, from a maximum value Nmax to a value Nmax/e, wherein e stands for Euler's number. A fall to 1/e corresponds approximately to a fall from 100% to 37%. In central sections of the second doped regions 192, the net dopant concentration 763 can be approximately constant.

Figure 9C:
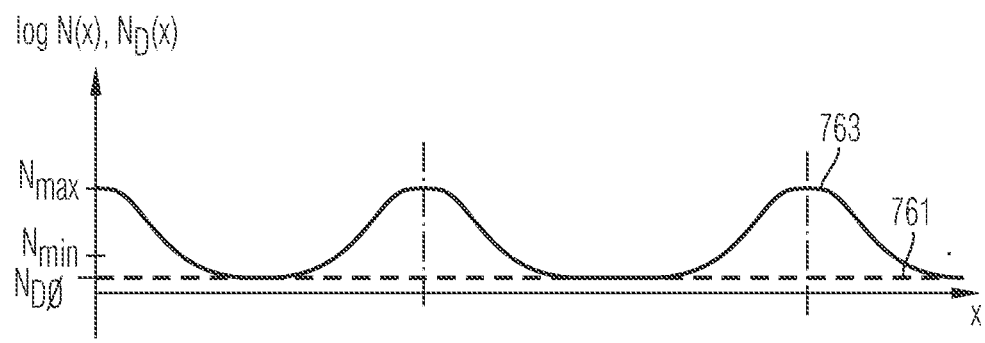
FIG. 9C is a schematic diagram for illustrating the lateral dopant distribution in the second and third doped regions of the edge termination structure from FIG. 9A along the line B-B for third doped regions of the same conductivity type as the second doped regions.

FIG. 9C represents the lateral profile of the net dopant concentration 763 along the line B-B for the case where the third doped regions 193 are completely oppositely doped.

The lateral dopant distribution described in FIGS. 9A to 9C results in the case of a corresponding lateral modulation of an ion beam used for forming the second doped regions 192 by ion implantation. By way of example, the ion beam can be laterally modulated with the aid of an energy filter arranged in the beam path of the ion beam or with the aid of a suitable neutral stepped mask, which is formed for instance by briefly heating a stepped mask, wherein the mask material runs slightly as a result of the heating. A lateral modulation of the ion beam also results if the ion beam is guided at different angles through the openings in a stepped mask of sufficient height.

Figure 10:
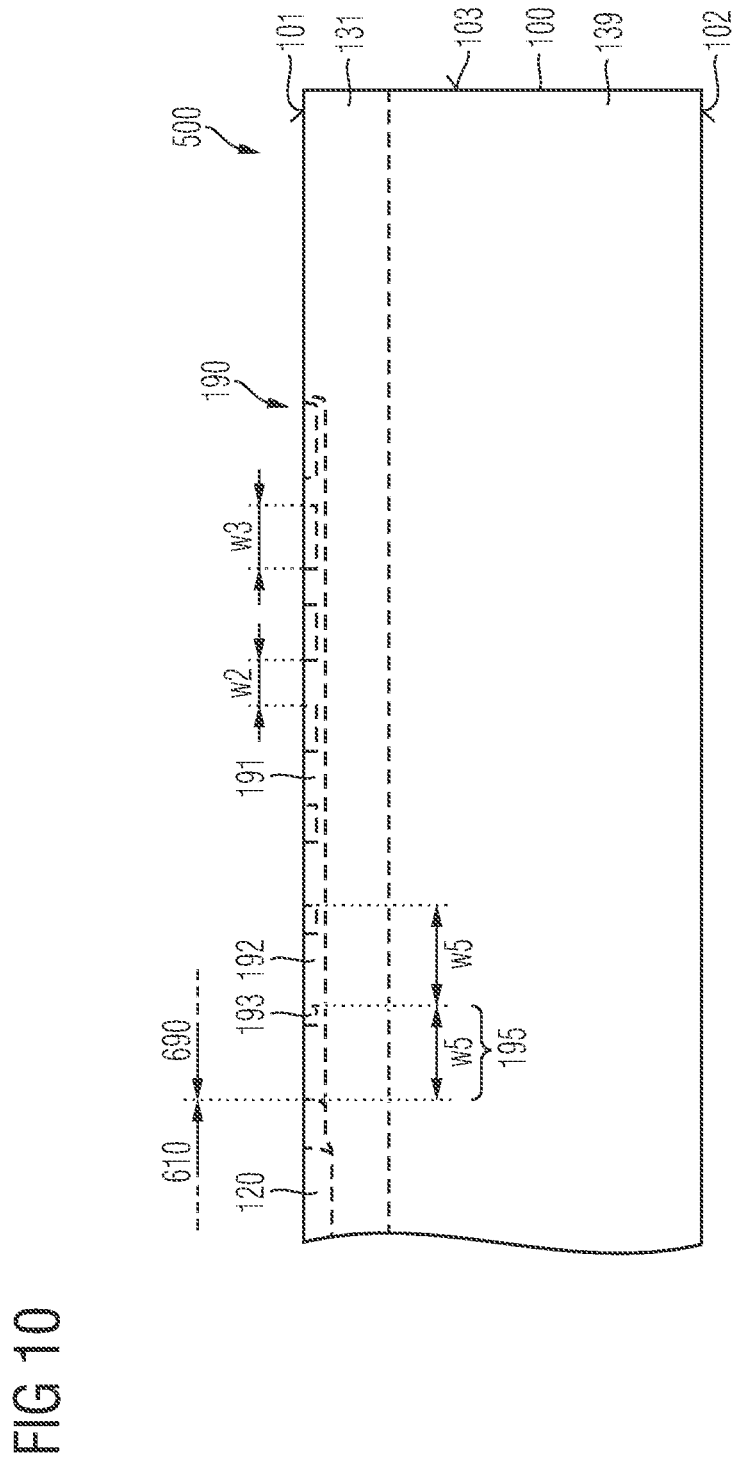
FIG. 10 is a schematic vertical cross section through a portion of a semiconductor component with edge termination structure comprising a first doped region and second doped regions between a first surface and the first doped region in accordance with a further embodiment.

FIG. 10 shows a vertical cross section through an edge termination region 690 between an active region 610 and a side surface 103 of an SiC semiconductor body 100 of a semiconductor component 500. The first doped region 191 and the innermost second doped region 192 of an edge termination structure 190 are directly adjacent to a doped region of the same conductivity type, e.g. a body region or an anode region 125 in the active region 610. The dopant dose in the second doped regions 192 is for example four times the dopant dose in the first doped region 191.

The second doped regions 192 are introduced by one or more, for example three, implantations of varying energy through openings in an implantation mask. A width ws of substructures 195 formed in each case from a second doped region 192 and a third region 193 adjoining the second doped region 192 on the side facing away from the active region 610 remains constant, wherein a lateral width w2 of the second doped regions 192 decreases with increasing distance from the active region 610 and a lateral width w3 of the third doped regions 193 correspondingly increases with increasing distance from the active region 610. The decrease in the lateral width w2 and the increase in the lateral width w3 can be provided in linear fashion, i.e. in uniform steps.

The following FIGS. 11A to 13F show dopant distribution, avalanche rate and electric field distribution for a structure according to FIG. 10, wherein the dopant dose for the edge termination structure 190 is varied in each case.

FIGS. 11A, 12A and 13A relate to a dopant dose of 40%, FIGS. 11B, 12B and 13B relate to a dopant dose of 120%, FIGS. 11C, 12C and 13C relate to a dopant dose of 200%, FIGS. 11D, 12D and 13D relate to a dopant dose of 400%, FIGS. 11E, 12E and 13E relate to a dopant dose of 680%, and finally FIGS. 11F, 12F and 13F relate to a dopant dose of 800% of a reference dose of $1 \times 10^{13}$ cm$^{-2}$.

In FIGS. 11A to 11F, the line 403 in each case represents the boundary of the space charge zone at the instant of the avalanche breakdown. For implantation doses of 120% or more, the breakdown location is pinned independently of the implantation dose within the active region 610.

FIGS. 12A to 12F in each case indicate the distribution of the impact ionization density K and show that the location of the maximum impact ionization density remains unchanged for implantation doses of between 120% and 800%.

FIGS. 13A to 13F in each case indicate the distribution of the electric field strength E and show a homogenous field distribution increasing with the implantation dose from the inner area outwards over a wide range of the implantation dose from 120% to 800%.

Figure 14:
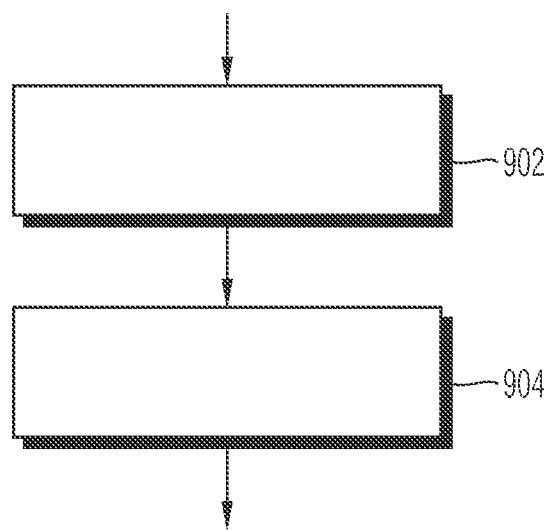
FIG. 14 is a simplified flow diagram for a method for producing semiconductor components comprising an edge termination structure in accordance with a further embodiment.

In accordance with FIG. 14, a method for producing a component comprises forming (902) an oppositely doped zone in an initial layer of an SiC semiconductor substrate, wherein the initial layer is of a first conductivity type and the oppositely doped zone partly or completely surrounds an active region of a component region. The method furthermore comprises forming (904) second doped regions of the second conductivity type, which extend from a first main surface of the SiC semiconductor substrate as far as the first doped region, are laterally spaced apart from one another and in each case at least partly or completely surround the active region. The first doped region is formed from at least one section of the oppositely doped zone. The first doped region, the second doped regions and third doped regions between the second doped regions form an edge termination structure.

The second doped regions can be formed with a higher dopant dose than the first doped region. The oppositely doped zone can be formed at a distance from the first main surface, wherein the second doped regions extend from the first main surface as far as the oppositely doped zone and the first doped region is formed by the oppositely doped zone. As an alternative thereto, the oppositely doped zone can be formed in a manner extending from the first main surface, wherein a vertical extent of the second doped regions is less than a vertical extent of the oppositely doped zone, and wherein the first doped region is formed by a section of the oppositely doped zone that is adjacent to the second doped regions in a vertical direction. Forming the second doped regions can comprise introducing a dopant of the second conductivity type into subregions of the initial layer that are laterally spaced apart from one another. Forming the second doped regions can comprise forming a second doped zone of the second conductivity type, said second doped zone extending from the first main surface into the initial layer, and at least partly oppositely doping sections of the second doped zone by a dopant of the first conductivity type. Forming the second or third doped regions can comprise an ion implantation in which the ion beam is laterally modulated, such that in the second or third doped regions a net dopant distribution in a lateral direction falls within at least 200 nm, for example within at least 500 nm, continuously from a maximum net dopant concentration Nmax to a concentration Nmax/e, wherein e is Euler's number.

Figure 15A:
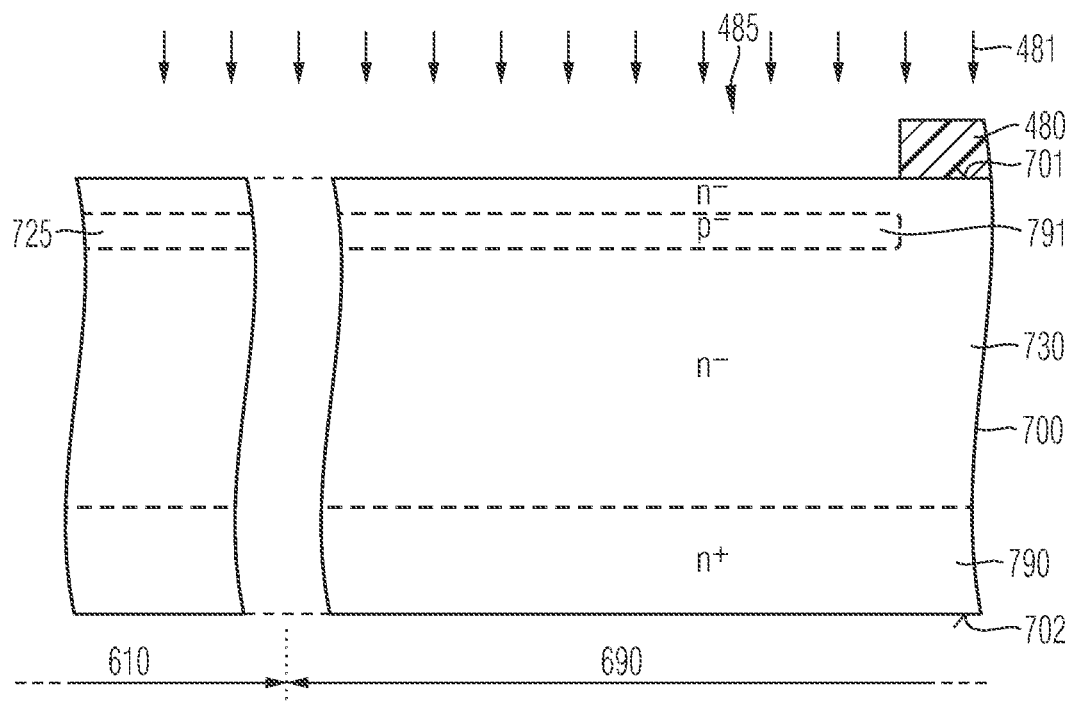
FIG. 15A is a schematic vertical cross section through a portion of an SiC semiconductor substrate for illustrating a method for producing a semiconductor component with edge termination structure in accordance with one embodiment, during an implementation for forming a first doped region of the edge termination structure.
Figure 15B:
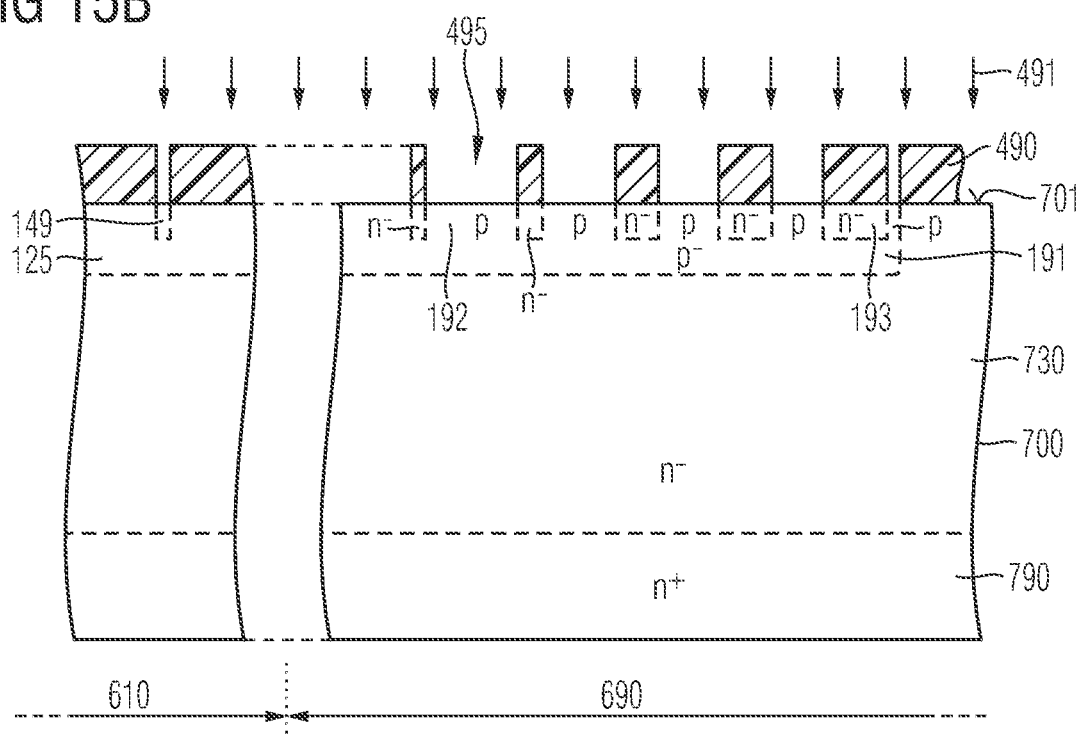
FIG. 15B is a schematic vertical cross section through the portion of the SiC semiconductor substrate according to FIG. 15A during an implementation for forming second doped regions of the edge termination structure.

FIGS. 15A and 15B relate to a method in which the first doped region 191 is formed independently of the second doped regions 192.

An SiC semiconductor substrate 700 is provided, comprising a highly doped substrate section 790 and an initial layer 730 grown on the substrate section 790 for example by means of an epitaxy method.

In the exemplary embodiment depicted, both the substrate section 790 and the initial layer 730 are n-doped. The initial layer 730 can be uniformly doped, with an average dopant concentration in the range of $5 \times 10^{14}$ cm$^{-3}$ to $5 \times 10^{16}$ cm$^{-3}$. An oppositely doped zone 791 is formed at a distance from the first main surface 701.

FIG. 15A shows the formation of the oppositely doped zone 791 by means of the implantation of a first dopant 481 through openings 485 in a first implantation mask 480. The implantation for forming the oppositely doped zone 791 can comprise a single implantation or a plurality of implantations at different implantation energies. An energy filter for vertically spreading an implant can be arranged in the beam path of the ion beam.

A distance between the oppositely doped layer 791 and the first main surface 701 can be hundreds of nanometres, for example at least 500 nm and a maximum of 2 µm. At least one partial layer 725 of a shielding region, of a body region or of an anode region can be formed via further mask openings 485 in an active region 610 of a component region.

FIG. 15B shows the formation of second doped regions 192 by ion implantation of a second dopant 491 through openings 495 in a second implantation mask 490. Instead of the second implantation mask 490, a correspondingly structured energy filter can be arranged in the beam path of the ion beam. The second doped regions 192 can be formed such that they extend from the first main surface 701 as far as the oppositely doped zone 791 from FIG. 15A.

The oppositely doped zone 791 forms the first doped region 191 of the edge termination structure 190. The initial doping of the initial layer 730 is maintained in the regions between the second doped regions 192 that are covered by the mask sections of the second implantation mask 490. The relevant regions form the third doped regions 193 of the edge termination structure 190. By way of example, contact regions of body regions, contact regions of shielding regions or a contact region 149 for an anode region 125 can be formed through further openings 495 in the second implantation mask 490 in the active region 610.

Figure 16A:
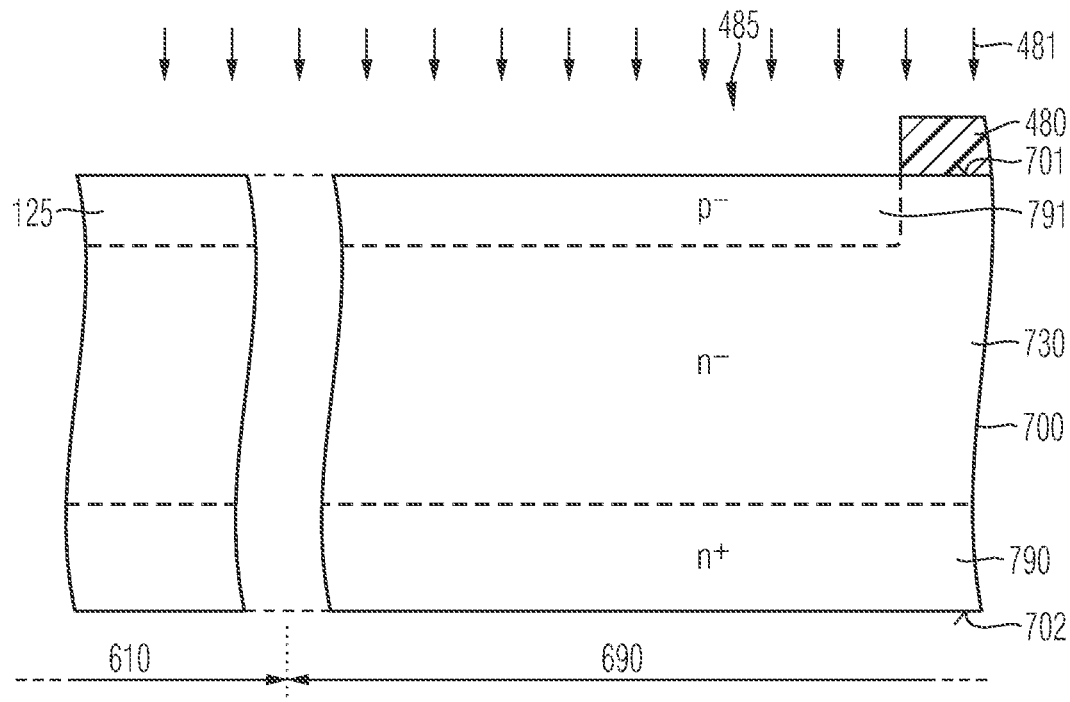
FIG. 16A is a schematic vertical cross section through a portion of an SiC semiconductor substrate for illustrating a method for producing a semiconductor component with edge termination structure in accordance with a further embodiment, during an implementation for forming a first doped region of the edge termination structure.
Figure 16B:
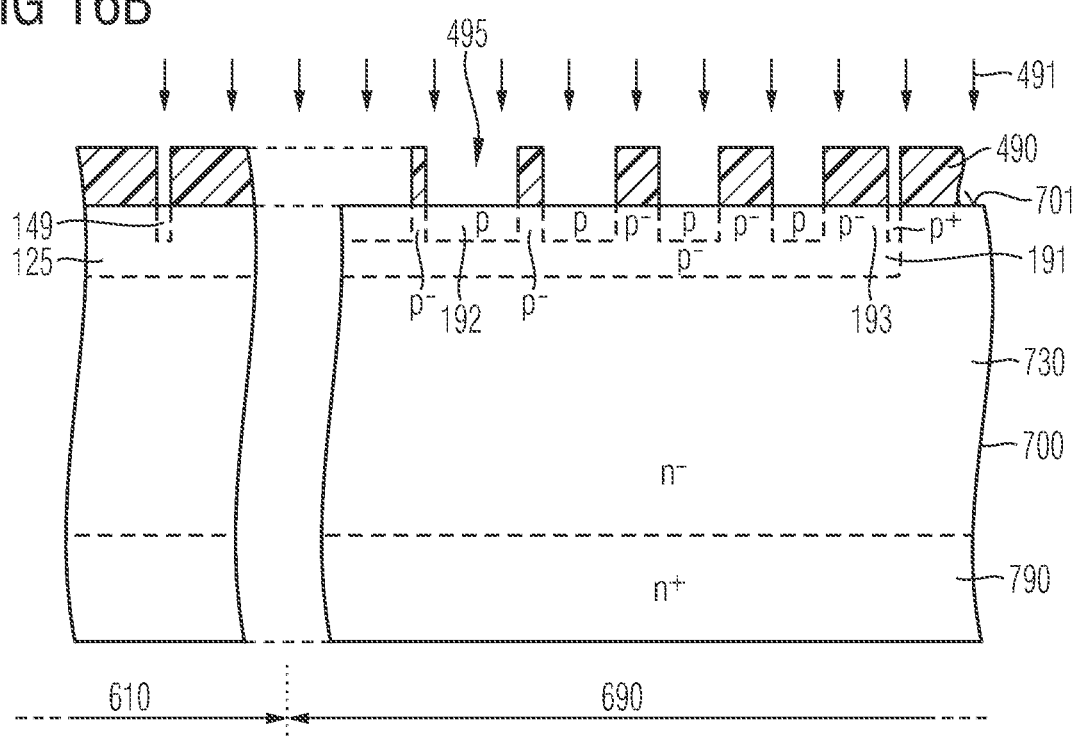
FIG. 16B is a schematic vertical cross section through the portion of the SiC semiconductor substrate according to FIG. 16A during an implementation for forming second doped regions of the edge termination structure.

In accordance with the embodiment illustrated in FIGS. 16A to 16B, the oppositely doped zone 791 produced using the first implantation mask 480 extends from the first main surface 701 into the initial layer 730.

FIG. 16A shows the formation of the oppositely doped zone 791, which can comprise a plurality of implantations at different implantation energies. Simultaneously with the oppositely doped zone 791, body regions, shielding regions or an anode region 125 adjacent to the first main surface 701 can be formed through further mask openings in active regions 610.

FIG. 16B shows the formation of the second doped regions 192, which can be defined for example with the aid of the second implantation mask 490 as described in FIG. 15B. The original doping of the oppositely doped zone 791 is maintained in the regions of the oppositely doped zone 791 that are covered by the second implantation mask 490. The relevant regions form third doped regions 193 of the edge termination structure 190, wherein in this case the third doped regions 193 have the same conductivity type as the second doped regions 192 and are differentiable therefrom only by virtue of a lower dopant concentration. By way of example, the dopant concentration in the third doped regions 193 is only 25% of the dopant concentration in the second doped regions 192. By way of example, the dopant concentration in the third doped regions 193 is of the same magnitude as in the first doped region 191.

Figure 17A:
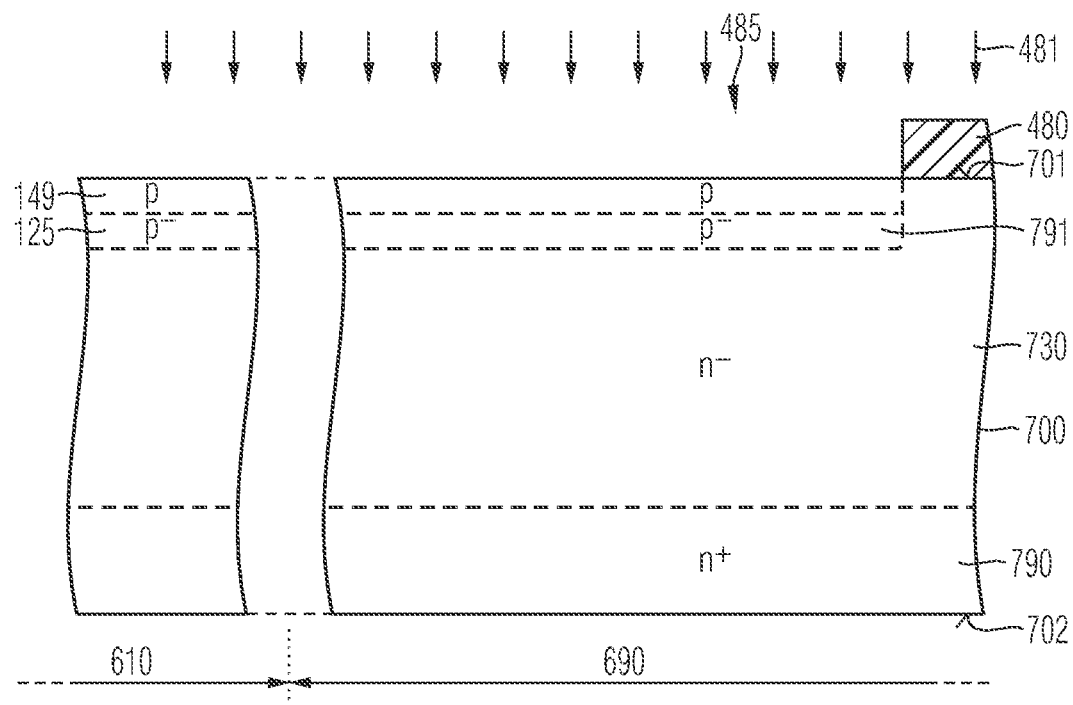
FIG. 17A is a schematic vertical cross section through a portion of an SiC semiconductor substrate for illustrating a method for producing a semiconductor component with edge termination structure in accordance with a next embodiment, during an implementation for forming a first doped region of the edge termination structure.

FIG. 17A shows the formation of an oppositely doped zone 791 extending from the first main surface 701 into the SiC semiconductor substrate 700, wherein an upper section of the oppositely doped zone 791 between the first main surface 701 and a lower section is formed with a higher dopant concentration than the lower section.

Figure 17B:
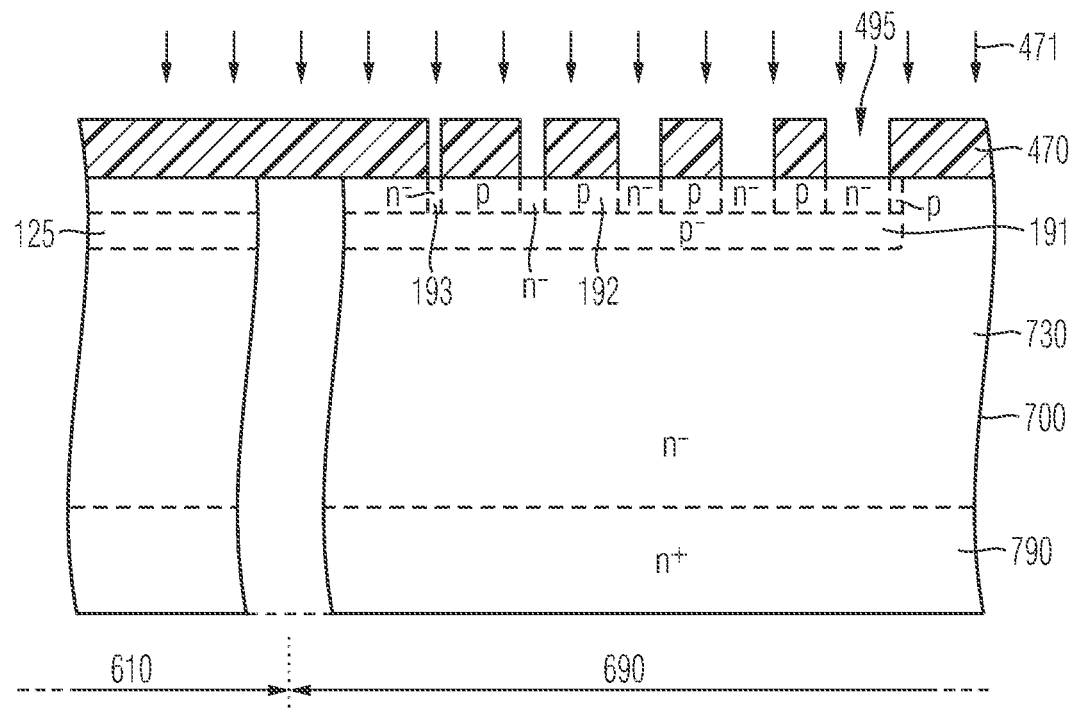
FIG. 17B is a schematic vertical cross section through the portion of the SiC semiconductor substrate according to FIG. 17A during an implementation for forming third doped regions of the edge termination structure.

FIG. 17B shows a third implantation mask 470 having mask openings 475, which expose regions in which the third doped regions 193 are formed, said mask covering regions in which the second doped regions 192 are formed from subsections of the upper section of the oppositely doped zone 791. The implantation with a dopant 471 of the conductivity type of the initial layer 730 forms the third doped regions 193 by renewed opposite doping of subregions of the upper section of the oppositely doped zone 791.

Figure 18:
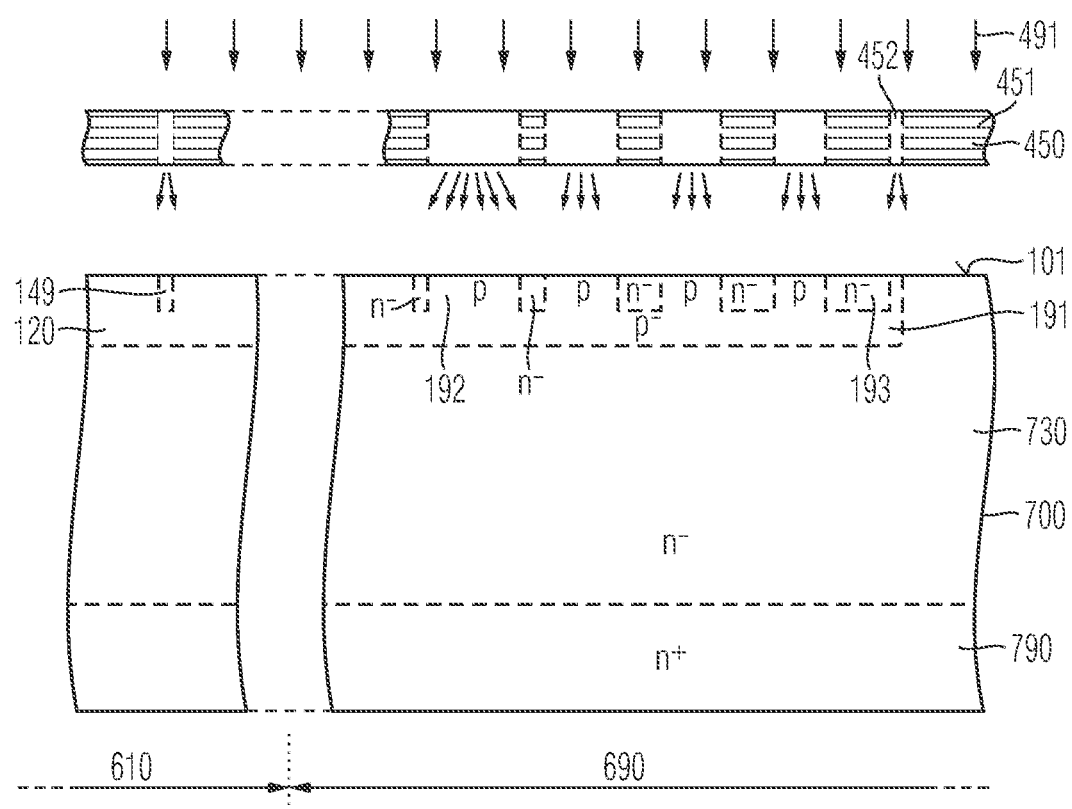
FIG. 18 is a schematic cross section through a portion of an SiC semiconductor substrate for illustrating a method for forming second doped regions of an edge termination structure having shallow lateral pn dopant concentration junctions in accordance with a further embodiment.

FIG. 18 shows an ion beam modulation device 450 in the beam path of an ion beam for the second dopant 491 from FIG. 15B. The ion beam modulation device 450 laterally modulates the ion beam, such that in the second doped regions 192 a net dopant distribution in a lateral direction falls within at least 200 nm, for example within at least 500 nm, continuously from a maximum net dopant concentration Nmax to a concentration Nmax/e, wherein e is Euler's number.

The ion beam modulation device 450 can comprise for example a laterally structured energy filter having almost non-transmissive first sections 451 and transmissive second sections 452. In the second sections 452, energy and emergence angles of the ions are modulated depending on the impingement location such that the ion beam is split into partial beams which expand between the energy filter and the SiC semiconductor substrate 700, wherein the ion density in each partial beam decreases continuously towards the outside.

According to another embodiment, the ion beam modulation device 450 comprises a neutral stepped mask, which is formed for instance by briefly heating a stepped mask, wherein the mask material runs slightly as a result of the heating. A lateral modulation of the ion beam also results if the ion beam is guided at different angles through the openings in a stepped mask of sufficient height.

In the following, further embodiments of the semiconductor component are explained in detail. It is to be understood that the features mentioned above and those yet to be explained below may be used not only in the respective combinations indicated, but also in other combinations or in isolation without departing from the scope of the invention.

In some embodiments, the third doped regions are completely enclosed by the first doped regions and the second doped regions, e.g. by each of the first doped regions and the second doped regions. In addition or as an alternative, each of the first and second doped regions may completely enclose the active region.

According to at least one embodiment, a dopant dose of the second doped regions is higher than a dopant dose of the first doped region. For example, the dopant dose of the second doped regions is at least double the magnitude of the dopant dose of the first doped region.

In some embodiments, a vertical extent of the edge termination structure is at least 80% and at most 100% of a distance between lower edge of the deepest doped region of the second conductivity type within the active region.

In some embodiments, the active region comprises further doped regions of the second conductivity type and a vertical extent of the edge termination structure is at least 80% of a distance between a deepest lower edge of the further doped regions in the active region and the surface. The active region may further comprise at least one of: transistor cells of the second conductivity type gate electrodes formed on the first surface.

In some embodiments, the vertical extent of the edge termination structure is at least 80% of a distance between the first surface and a lower edge of the body regions.

According to at least one embodiment, the semiconductor component comprises gate structures comprising gate electrodes and extending from the first surface into the SiC semiconductor body. It may be possible that each of the body regions extends between two adjacent gate structures.

In addition or as an alternative, the transistor cells may comprise shielding regions of the second conductivity type. A distance between a lower edge of the shielding regions and the first surface may be greater than a vertical extent of the gate structures. The vertical extent of the edge termination structure may be at least 80% of the distance between the first surface and a lower edge of the shielding regions.

In some embodiments, the shielding regions vertically overlap the gate structures. In alternative embodiments, the shielding regions may be laterally spaced apart from the gate structures.

According to at least one embodiment, the active region comprises a continuous anode region of the second conductivity type which adjoins the first surface. Alternatively, the active region comprises a multiplicity of anode regions and channel sections of the drift region, which channel sections are located between the anode regions. The channel sections may adjoin the first surface and form Schottky contacts to a first load electrode.

In some embodiments, a dopant concentration of the third doped region is equal to a dopant concentration of the drift zone. Separately or in combination, the third doped region comprises dopants of the second conductivity type and a dopant concentration of the second conductivity type is equal to a dopant concentration in the first doped region. Separately or in combination, a dopant dose for the first doped region is in a range of $2\times10^{12}$ cm$^{-2}$ to $2\times10^{13}$ cm$^{-2}$.

In some embodiments, a dopant concentration within the second doped regions is constant in a lateral direction. Separately or in combination, a dopant concentration of the second doped regions is at least $1\times10^{17}$ cm$^{-3}$.

According to at least one embodiment of the semiconductor component, the further doped regions and/or the anode region comprise(s) highly doped subregions. A dopant concentration of the highly doped subregions may be equal to the dopant concentration in the second doped regions.

According to at least one embodiment of the semiconductor component, a lateral width of the second doped regions decreases with increasing distance from the active region.

In some embodiments, the semiconductor component may comprise substructures. Each of the substructures may be formed from a second doped region and a third region adjoining the second doped region. The third region may adjoin the second region on a side facing away from the active region. A width of each of the substructures may be constant.

Separately or in combination, a lateral net dopant concentration in the second doped regions falls within at least 200 nm (e.g. a lateral distance of at least 200 nm) from a maximum net dopant concentration Nmax to a concentration Nmax/e, wherein e is Euler's number. For example, the lateral net dopant concentration continuously and/or monotonically decrease from Nmax to Nmax/e within a lateral distance of 200 nm.

The third doped region may be of the first conductivity type. Alternatively, the third doped region may be of the second conductivity type. In the latter case, a dopant concentration in the third doped region may be at most 50% of a dopant concentration in the second doped regions and/or a dopant concentration in the third doped region may be equal to the dopant concentration in the first doped region.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
a SiC semiconductor body having an active region and an edge termination structure at least partly surrounding the active region, wherein in the SiC semiconductor body a drift zone of a first conductivity type is formed and the edge termination structure comprises:
a first doped region of a second conductivity type between a first surface of the SiC semiconductor body and the drift zone, the first doped region at least partly surrounding the active region and being spaced apart from the first surface;
a plurality of second doped regions of the second conductivity type between the first surface and the first doped region; and
third doped regions of the first conductivity type separating adjacent second doped regions of the plurality of second doped regions from one another in a lateral direction.

2. The semiconductor component of claim 1, wherein each of the third doped regions is completely enclosed by the first doped region and the plurality of second doped regions.

3. The semiconductor component of claim 1, wherein a vertical extent of the edge termination structure is at least 80% and at most 100% of a distance between a lower edge of a deepest doped region of the second conductivity type within the active region.

4. The semiconductor component of claim 1, wherein a dopant dose of the plurality of second doped regions is higher than a dopant dose of the first doped region.

5. The semiconductor component of claim 1, wherein the active region comprises further doped regions of the second conductivity type, and wherein a vertical extent of the edge termination structure is at least 80% of a distance between a deepest lower edge of the further doped regions in the active region and the first surface.

6. The semiconductor component of claim 5, wherein the active region comprises transistor cells comprising body regions of the second conductivity type, and wherein the vertical extent of the edge termination structure is at least 80% of a distance between the first surface and a lower edge of the body regions.

7. The semiconductor component of claim 1, wherein the active region comprises transistor cells comprising body regions of the second conductivity type, wherein the transistor cells comprise shielding regions of the second conductivity type, and wherein a distance between a lower edge of the shielding regions and the first surface is greater than a vertical extent of gate structures of the transistor cells.

8. The semiconductor component of claim 7, wherein the vertical extent of the edge termination structure is at least 80% of the distance between the first surface and a lower edge of the shielding regions.

9. The semiconductor component of claim 1, wherein the active region comprises a plurality of anode regions and channel sections between the anode regions, and wherein the channel sections adjoin the first surface and form Schottky contacts to a first load electrode.

10. The semiconductor component of claim 1, wherein a dopant concentration of the third doped regions is equal to a dopant concentration of the drift zone.

11. The semiconductor component of claim 1, wherein the third doped regions comprise dopants of the second conductivity type and a dopant concentration of the second conductivity type is equal to a dopant concentration in the first doped region.

12. The semiconductor component of claim 1, wherein a dopant dose for the first doped region is in a range of $2\times10^{12}$ cm$^{-2}$ to $2\times10^{13}$ cm$^{-2}$ and/or a dopant concentration of the second doped regions is at least $1\times10^{17}$ cm$^{-3}$.

13. The semiconductor component of claim 1, wherein within the plurality of second doped regions, a dopant concentration is constant in a lateral direction.

14. The semiconductor component of claim 1, wherein the active region comprises further doped regions of the second conductivity type or a plurality of anode regions and channel sections between the anode regions, and wherein the further doped regions or the plurality of anode regions comprise highly doped subregions and a dopant concentration of the highly doped subregions is equal to the dopant concentration in the plurality of second doped regions.

15. The semiconductor component of claim 1, wherein a lateral width of the plurality of second doped regions decreases with increasing distance from the active region.

16. The semiconductor component of claim 1, further comprising substructures, wherein each of the substructures is formed from one of the second doped regions and one of the third regions which adjoins the second doped region on a side facing away from the active region, and wherein a width of the substructures is constant.

17. A semiconductor component, comprising:
- a SiC semiconductor body having an active region and an edge termination structure at least partly surrounding the active region, wherein in the SiC semiconductor body a drift zone of a first conductivity type is formed and the edge termination structure comprises:
- a first doped region of a second conductivity type between a first surface of the SiC semiconductor body and the drift zone, the first doped region at least partly surrounding the active region and being spaced apart from the first surface;
- a plurality of second doped regions of the second conductivity type between the first surface and the first doped region; and
- a third doped region between adjacent second doped regions of the plurality of second doped regions.

18. The semiconductor component of claim 17, wherein a lateral net dopant concentration in the plurality of second doped regions continuously decreases within a lateral distance of at least 200 nm from a maximum net dopant concentration Nmax to a concentration Nmax/e, wherein e is Euler's number.

19. The semiconductor component of claim 17, wherein each third doped region is of the second conductivity type and a dopant concentration in each third doped region is at most 50% of a dopant concentration in the plurality of second doped regions.

20. The semiconductor component of claim 17, wherein each third doped region is of the second conductivity type and a dopant concentration in each third doped region is equal to the dopant concentration in the first doped region.

* * * * *